(12) United States Patent
Marcinkiewicz

(10) Patent No.: US 11,277,003 B2
(45) Date of Patent: Mar. 15, 2022

(54) MULTI-PHASE EMI AND TRANSIENT PROTECTION CIRCUITS AND SYNCHRONOUS RECTIFICATION CONTROL FOR COMPRESSORS OF REFRIGERATION SYSTEMS

(71) Applicant: Emerson Climate Technologies, Inc., Sidney, OH (US)

(72) Inventor: Joseph G. Marcinkiewicz, St. Peters, MO (US)

(73) Assignee: Emerson Climate Technologies, Inc., Sidney, OH (US)

( * ) Notice: Subject to any disclaimer, the term of this patent is extended or adjusted under 35 U.S.C. 154(b) by 21 days.

(21) Appl. No.: 16/993,710

(22) Filed: Aug. 14, 2020

(65) Prior Publication Data

US 2021/0218244 A1 Jul. 15, 2021

Related U.S. Application Data

(60) Provisional application No. 62/958,850, filed on Jan. 9, 2020.

(51) Int. Cl.
*H02H 9/04* (2006.01)
*H01C 7/12* (2006.01)
(Continued)

(52) U.S. Cl.
CPC ............. *H02H 9/042* (2013.01); *B60L 1/003* (2013.01); *B60P 3/20* (2013.01); *F25B 49/022* (2013.01);
(Continued)

(58) Field of Classification Search
CPC ........ H02H 9/042; H02H 9/045; B60L 1/003; B60P 3/20; F25B 49/022; H01F 17/00;
(Continued)

(56) References Cited

U.S. PATENT DOCUMENTS

| 10,210,982 | B1* | 2/2019 | Xu | H01F 38/14 |
| 2015/0222170 | A1* | 8/2015 | Berger | H02J 3/385 |
| | | | | 363/40 |
| 2017/0302165 | A1* | 10/2017 | Marcinkiewicz | H02M 7/06 |

FOREIGN PATENT DOCUMENTS

EP 3576279 A1 12/2019
KR 101979452 B1 5/2019

OTHER PUBLICATIONS

International Search Report regarding Application No. PCT/US2021/012785 dated Apr. 29, 2021.
(Continued)

*Primary Examiner* — Yemane Mehari
(74) *Attorney, Agent, or Firm* — Harness, Dickey & Pierce, P.L.C.

(57) ABSTRACT

A drive for a mobile compressor includes EMI and transient protection circuits, second chokes, converters and an inverter. The EMI and transient protection circuits include respectively common mode chokes and at least one component. Each of the common mode chokes is configured to receive a first direct current voltage and is connected to first and second grounds. The at least one component is connected to a third ground. The first, second and third grounds are at different voltage potentials. The second chokes are connected downstream from the common mode chokes. The converters are connected to outputs of the second chokes and are configured to collectively provide a second direct current voltage to a direct current bus. The inverter is connected to the direct current bus and configured to convert the second direct current voltage to an alternating current voltage to power the mobile compressor downstream from the inverter.

33 Claims, 15 Drawing Sheets

(51) Int. Cl.
*H03H 7/01* (2006.01)
*H02M 7/797* (2006.01)
*H02J 7/00* (2006.01)
*F25B 49/02* (2006.01)
*B60P 3/20* (2006.01)
*B60L 1/00* (2006.01)
*H01F 17/00* (2006.01)
*H02M 7/44* (2006.01)

(52) U.S. Cl.
CPC ............... *H01C 7/12* (2013.01); *H01F 17/00* (2013.01); *H02H 9/045* (2013.01); *H02J 7/007* (2013.01); *H02M 7/44* (2013.01); *H02M 7/797* (2013.01); *H03H 7/0138* (2013.01); *H01F 2017/0093* (2013.01)

(58) Field of Classification Search
CPC ... H01F 2017/0093; H02J 7/007; H02M 7/44; H02M 7/797; H03H 7/0138; H01C 7/12
USPC ........................................................ 361/118
See application file for complete search history.

(56) References Cited

OTHER PUBLICATIONS

Written Opinion of the ISA regarding Application No. PCT/US2021/012785 dated Apr. 29, 2021.

\* cited by examiner

MULTI-PHASE EMI AND TRANSIENT PROTECTION CIRCUITS AND SYNCHRONOUS RECTIFICATION CONTROL FOR COMPRESSORS OF REFRIGERATION SYSTEMS

CROSS-REFERENCE TO RELATED APPLICATIONS

This application claims the benefit of U.S. Provisional Application No. 62/958,850, filed on Jan. 9, 2020. The entire disclosure of the application referenced above is incorporated herein by reference.

FIELD

The present disclosure relates to vehicles and, more particularly, to drives of refrigeration systems of vehicles.

BACKGROUND

Compressors may be used in a wide variety of industrial and residential applications to circulate refrigerant to provide a desired heating or cooling effect. For example, a compressor may be used to provide heating and/or cooling in a refrigeration system, a heat pump system, a heating, ventilation, and air conditioning (HVAC) system, or a chiller system. These types of systems can be fixed, such as at a building or residence, or can be mobile, such as in a vehicle. Vehicles include land based vehicles (e.g., trucks, cars, trains, etc.), water based vehicles (e.g., boats), air based vehicles (e.g., airplanes), and vehicles that operate over a combination of more than one of land, water, and air.

Small to mid-sized refrigerated truck systems can include eutectic plates. The eutectic plates are disposed within a box of the corresponding truck and are used to maintain an air temperature within the box and thus contents of the box below a predetermined temperature. The eutectic plates are filled with a fluid and are designed to freeze at a certain temperature. The eutectic plates can be cooled to a medium temperature (e.g., 35° F.) or a low temperature (e.g., less than or equal to 0° F.). The refrigerated truck systems typically pull down a temperature of the eutectic plates at night while the truck is parked at a depot. The refrigerated truck systems typically do not run while the truck is in service (i.e. while standing at a site or while traveling between sites).

Some refrigerated truck systems include, in addition to the eutectic plates, a blower/evaporator (hereinafter referred to as an "evaporator"). The evaporator is run as needed and to maintain a temperature within a box of the truck while the corresponding truck is in route between sites. The evaporator is powered by a battery pack. The battery pack is charged by shore power, solar power or via an alternator and/or generator. The alternator and/or generator are driven by an engine of the truck.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

A drive for a mobile compressor is provided and includes electromagnetic interference and transient protection circuits, second chokes, converters and an inverter. The electromagnetic interference and transient protection circuits include respectively common mode chokes and at least one component. Each of the common mode chokes is configured to receive a first direct current voltage and is connected to first and second grounds. The at least one component of each of the electromagnetic interference and transient protection circuits is connected to a third ground. The first, second and third grounds are at different voltage potentials. The second chokes are connected downstream from the common mode chokes. The converters are connected to outputs of the second chokes and are configured to collectively provide a second direct current voltage to a direct current bus. The inverter is connected to the direct current bus and configured to convert the second direct current voltage to an alternating current voltage to power the mobile compressor downstream from the inverter.

In other features, the first ground is a negative battery terminal. The second ground is a negative voltage bus reference for the second direct current voltage. The third ground is a chassis ground.

In other features, each of the electromagnetic interference and transient protection circuits includes an electromagnetic interference filter and a transient protection component, which are connected to the second ground.

In other features, the electromagnetic interference filters include capacitors. The transient protection components include varistors. In other features, the converters are implemented as synchronous rectifiers.

In other features, the drive further includes a controller configured to control the synchronous rectifiers, such that each of the converters provides a respective portion of a full cycle of an output signal provided to the inverter. The synchronous rectifiers collectively provide the output signal on the direct current bus. The output signal includes the second direct current voltage. In other features, the synchronous rectifiers generate respective outputs. The controller is configured to control the synchronous rectifiers, such that each of the outputs of the synchronous rectifiers is phase shifted from other ones of the synchronous rectifiers. In other features, the synchronous rectifiers are bi-directional and independently controlled to operate in a forward mode to power the mobile compressor and in a reverse mode to charge a direct current source.

In other features, each of the electromagnetic interference and transient protection circuits includes a damping circuit upstream from a corresponding one of the common mode chokes.

In other features, each of the electromagnetic interference and transient protection circuits includes an electromagnetic interference filter upstream from a corresponding one of the common mode chokes.

In other features, each of the electromagnetic interference and transient protection circuits includes one or more transient protection components upstream from a corresponding one of the common mode chokes.

In other features, each of the electromagnetic interference and transient protection circuits includes Y-capacitors having different capacitances downstream from a corresponding one of the common mode chokes.

In other features, each of the electromagnetic interference and transient protection circuits includes an X-capacitor downstream from a corresponding one of the common mode chokes.

In other features, each of the electromagnetic interference and transient protection circuits includes one or more transient protection components upstream from a corresponding one of the common mode chokes.

In other features, each of the electromagnetic interference and transient protection circuits includes a diode configured to bypass current from a corresponding one of the common mode chokes to the direct current bus, such that the current bypasses a corresponding one of the second chokes and a corresponding one of the converters.

In other features, the drive further includes a charging circuit connected upstream of the electromagnetic interference and transient protection circuits and configured to receive power from a direct current source and charge capacitors of the electromagnetic interference and transient protection circuits.

In other features, the drive further includes charging circuits downstream of the electromagnetic interference and transient protection circuits and configured to control transfer of power from the electromagnetic interference and transient protection circuits to the second chokes.

In other features, a drive for a mobile compressor is provided. The drive includes electromagnetic interference and transient protection circuits, first chokes, synchronous rectifiers and an inverter. The electromagnetic interference and transient protection circuits each configured to receive a first direct current voltage and are connected to a first ground or a second ground. Each of the electromagnetic interference and transient protection circuits includes an electromagnetic interference filter and a transient protection component. The electromagnetic interference filters and the transient protection components are connected to a third ground. The first ground, the second ground and the third ground are at different voltage potentials. The first chokes are connected downstream from the electromagnetic interference and transient protection circuits. The synchronous rectifiers are connected to outputs of the first chokes and configured to collectively provide a second direct current voltage to a direct current bus. The inverter is configured to convert the second direct current voltage to an alternating current voltage to power the mobile compressor downstream from the inverter.

In other features, a drive for a mobile compressor is provided and includes electromagnetic interference and transient protection circuits, first chokes, synchronous rectifiers and an inverter. Each of the electromagnetic interference and transient protection circuits is configured to receive a first direct current voltage and is connected to a first ground. Each of the electromagnetic interference and transient protection circuits includes an electromagnetic interference filter and a transient protection component. The electromagnetic interference filters and the transient protection components are connected to a second ground. The second ground is different than the first ground. The first chokes are connected downstream from the electromagnetic interference and transient protection circuits. The synchronous rectifiers are connected to outputs of the first chokes and configured to collectively provide a second direct current voltage to a direct current bus. The inverter is configured to convert the second direct current voltage to an alternating current voltage to power the mobile drive downstream from the inverter.

In other features, the first ground is a negative battery terminal. The second ground is a negative voltage bus reference for the second direct current voltage. The third ground is a chassis ground.

In other features, the electromagnetic interference filters include capacitors. The transient protection components include varistors.

In other features, the drive further includes a controller configured to control the synchronous rectifiers, such that each of the synchronous rectifiers provides a respective portion of a full cycle of an output signal provided to the inverter. The synchronous rectifiers collectively provide the output signal on the direct current bus. The output signal includes the second direct current voltage. In other features, the synchronous rectifiers generate respective outputs. The controller is configured to control the synchronous rectifiers, such that each of the outputs of the synchronous rectifiers is phase shifted from other ones of the synchronous rectifiers. In other features, the synchronous rectifiers are bi-directional and independently controlled by the controller to operate in a forward mode to power the mobile compressor and in a reverse mode to charge a direct current source.

In other features, each of the electromagnetic interference and transient protection circuits includes a diode configured to bypass current to the direct current bus, such that the current bypasses a corresponding one of the first chokes and a corresponding one of the synchronous rectifiers.

In other features, the electromagnetic interference and transient protection circuits include respectively second chokes.

In other features, the second chokes are common mode chokes.

In other features, each of the electromagnetic interference and transient protection circuits includes a damping circuit upstream from a corresponding one of the common mode chokes.

In other features, each of the electromagnetic interference filters is upstream from a corresponding one of the common mode chokes.

In other features, each of the transient protection components is upstream from a corresponding one of the common mode chokes.

In other features, each of the electromagnetic interference and transient protection circuits includes Y-capacitors having different capacitances downstream from a corresponding one of the common mode chokes.

In other features, each of the electromagnetic interference and transient protection circuits includes an X-capacitor downstream from a corresponding one of the common mode chokes.

In other features, each of the transient protection components is upstream from a corresponding one of the common mode chokes.

In other features, each of the transient protection components is downstream from a corresponding one of the common mode chokes.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

In the drawings, reference numbers may be reused to identify similar and/or identical elements.

DETAILED DESCRIPTION

A drive for supplying power to a compressor may include an EMI and transient protection circuit. The EMI and transient protection circuit receives direct current (DC) from a DC source at a first DC voltage, converts the first DC voltage to a second DC voltage and EMI filters the second DC voltage, which is then provided to one or more boost chokes. In order for the EMI and transient protection circuit to provide high-levels of current (e.g., 100 amperes (A)) to the one or more boost chokes to power the compressor, the components of the EMI and transient protection circuit need to be configured to handle the high current levels. For example, the EMI and transient protection circuit may include a common mode choke that provides the DC-to-DC conversion. A common mode choke capable of handle 100 A of current is large and expensive.

In addition, when the output of the EMI and transient protection circuit supplies power to multiple chokes (e.g., three boost chokes), since the same EMI and transient protection circuit is supplying power to the boost chokes, there is interaction between phases; each of the phases including one of the boost chokes. This interaction results in noise being seen at each of the phases. If all boost chokes are fed from the same EMI filter, noise from one phase is seen by the other phases resulting in undesirable interaction. At least some of the noise is associated with switching occurring downstream from the chokes, such as at boost converters and/or an inverter. Also, if there is a voltage drop in one of the phases, the other phases are affected due to the common (or shared) EMI and transient protection circuit.

Figure 7:
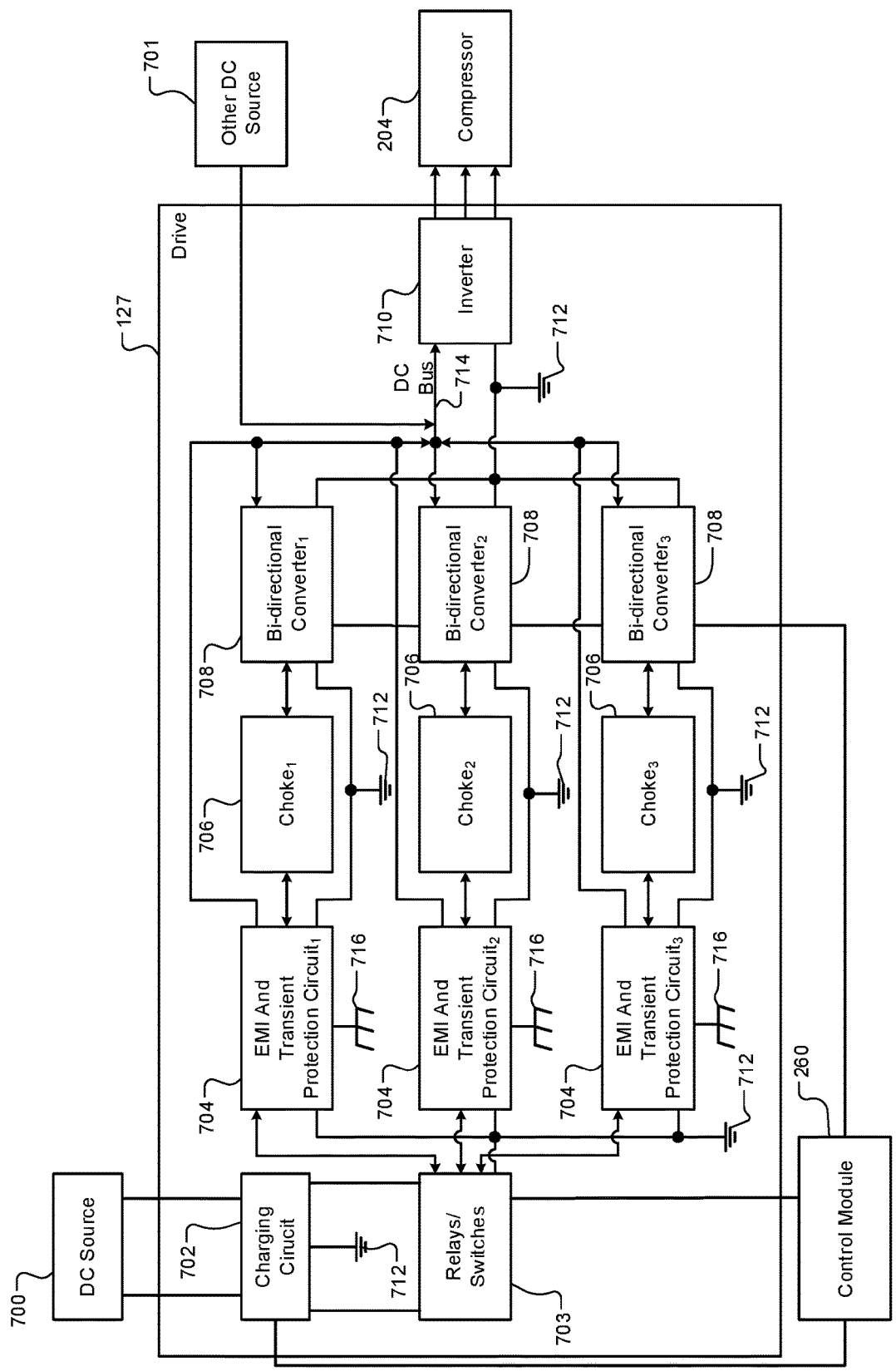
FIG. 7 is a functional block diagram of an example of the drive of FIGS. 1A and 1B.
Figure 8:
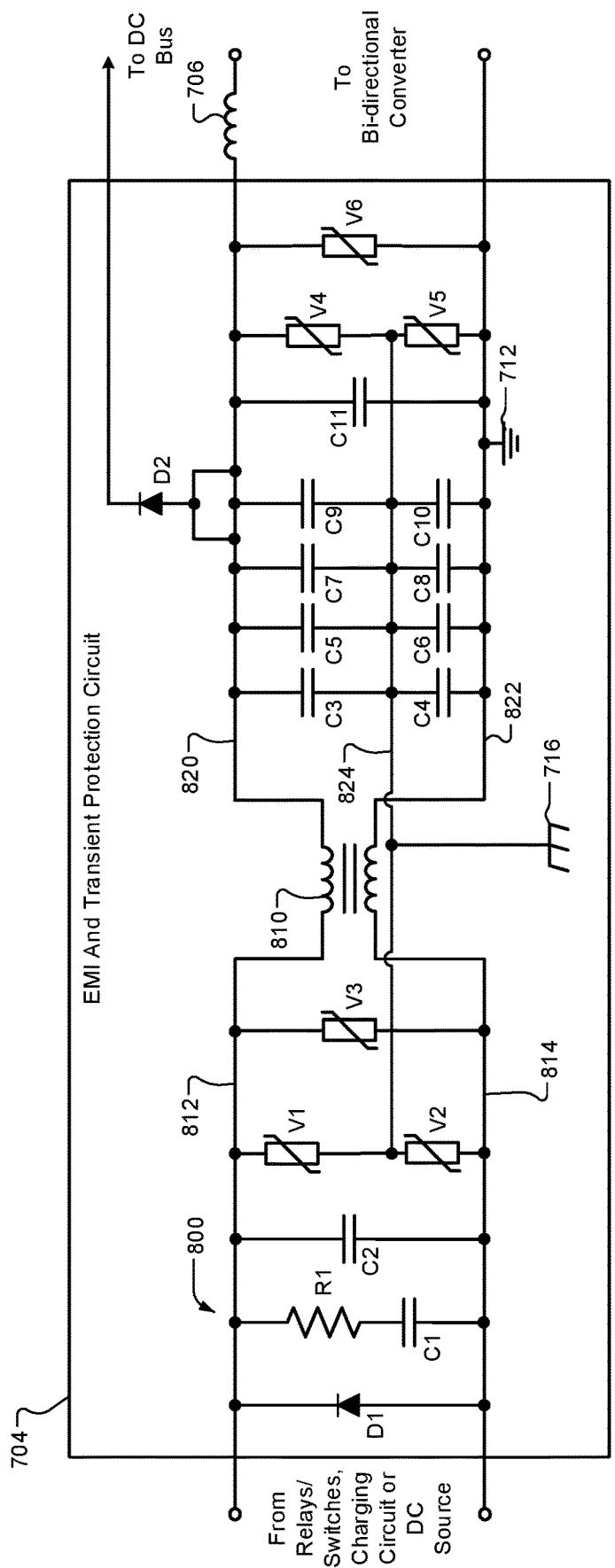
FIG. 8 is a schematic diagram of an example of one of the EMI and transient protection circuits of FIG. 7.

The examples disclosed herein overcome the above-stated disadvantages and include drives with multi-phase EMI and transient protection circuits. A detailed example of the drives is shown in FIG. 7 and a detailed example of the EMI and transient protection circuits is shown in FIG. 8. Each of the EMI and transient protection circuits corresponds to as a single phase (or channel) and includes a DC-to-DC conversion circuit that provides a portion of a total amount of current to a respective downstream choke and bi-directional converter. The bi-directional converters are implemented as synchronous rectifier circuits. Outputs of the bi-directional converters are combined and provided to a high-voltage DC bus. The different phases refer to interleaved channels having certain components. Timing of the bi-directional converters are controlled, such that power out of each of the bi-directional converters is out of phase from (advanced or delayed in time relative to) power of the other bi-directional converters.

Since multiple EMI and transient protection circuits are utilized, components of the EMI and transient protection circuits may be smaller in size and considerably less costly. For example, a common mode choke, capable of transferring 35 A of current, is smaller, much more common and substantially less costly than a common mode choke capable of transferring 100 A of current. The paths of the EMI and transient protection circuits have high conductance and resistance, which do not interact, such that there is no noise coupling between the phases. Also, if there is a voltage drop in one of the phases, the other phases are not affected, due to independent EMI and transient protection provided for each phase. Improved EMI filtering and better ripple current cancellation are also provided.

Figure 1A:
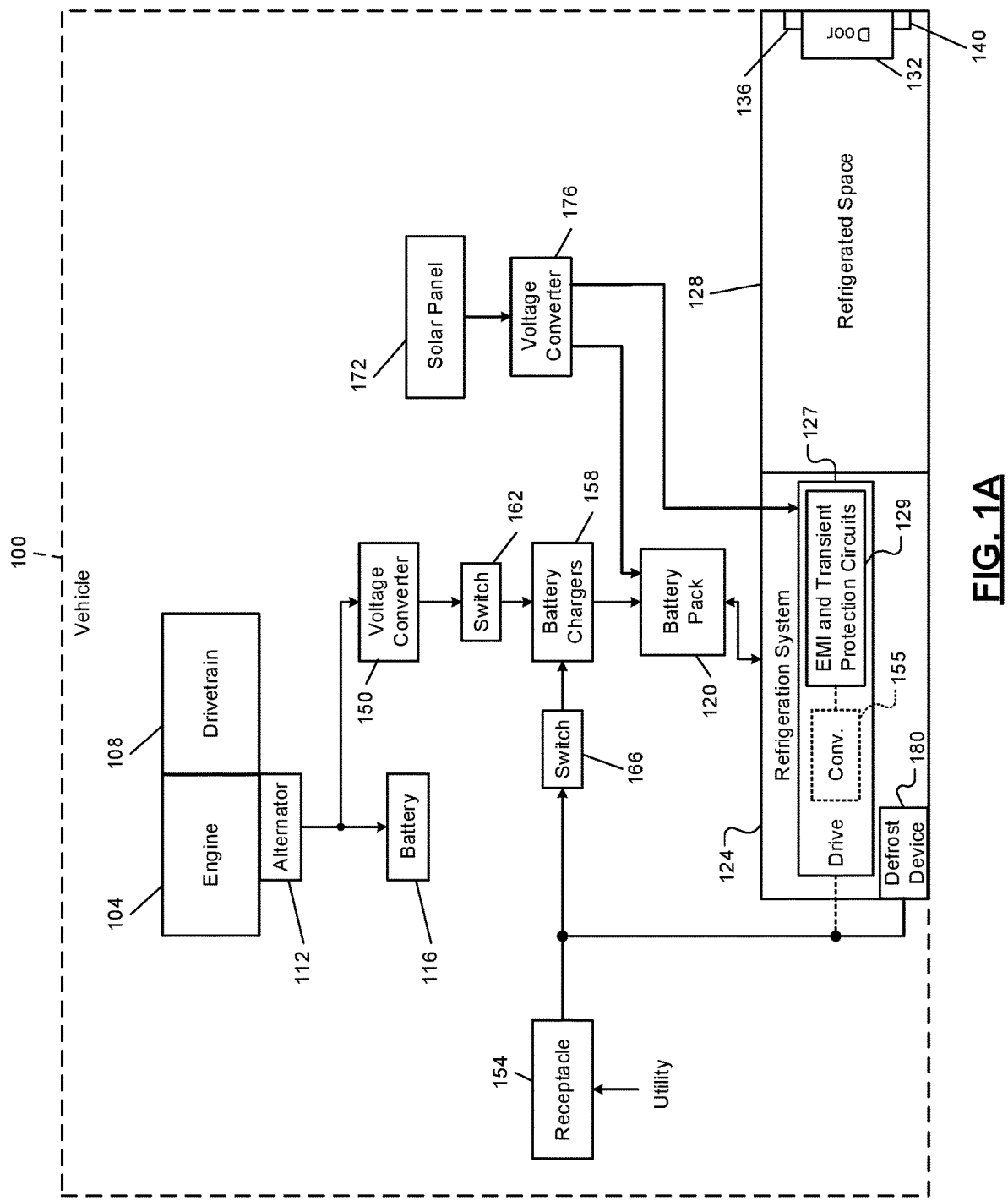
FIGS. 1A and 1B are functional block diagrams of example vehicle systems including a drive with an electromagnetic interference (EMI) and transient protection circuit in accordance with the present disclosure.
Figure 1B:
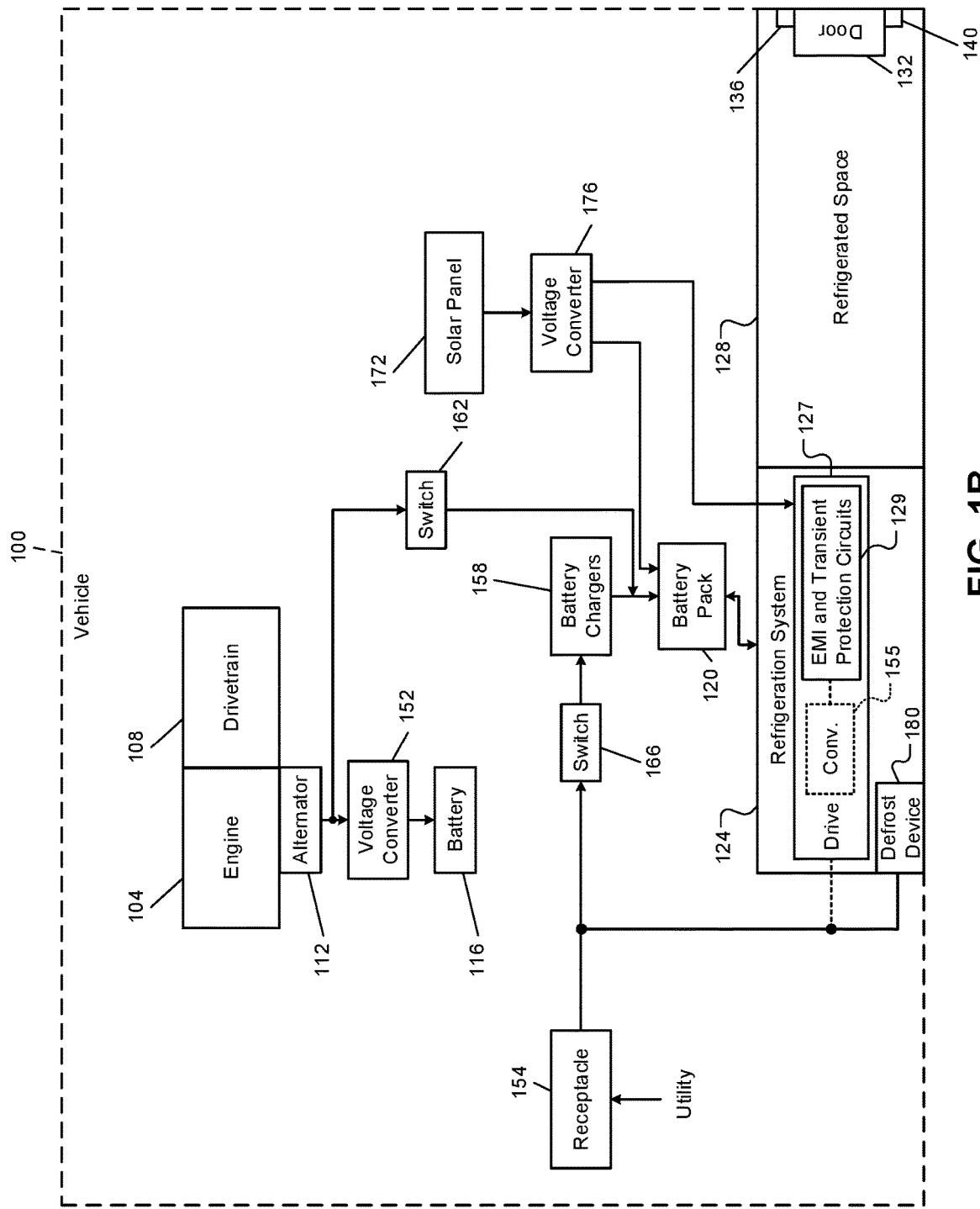

FIGS. 1A and 1B are functional block diagrams of example systems of a vehicle 100. The vehicle 100 includes an internal combustion engine 104 that combusts air and fuel within cylinders to generate propulsion torque for the vehicle 100. The engine 104 may combust, for example, gasoline, diesel fuel, natural gas, and/or one or more other types of fuel. The engine 104 outputs torque to a drivetrain 108. The drivetrain 108 transfers torque to two or more wheels of the vehicle. While the example of a wheeled vehicle is provided, the present application is not limited to vehicles having wheels and is also applicable to water and/or air based vehicles.

An electrical source 112 is driven by the engine 104 and converts mechanical energy of the engine 104 into electrical energy to charge a battery 116. The electrical source 112 may include an alternator, a generator, and/or another type of device that converts mechanical energy of the engine 104 into electrical energy. While the example of a single electrical source is provided, multiple or zero electrical sources driven by the engine 104 may be included. The electrical source 112 may be, for example, a 12 V alternator (e.g., in the example of FIG. 1A) and/or a 48 V alternator (e.g., in the example of FIG. 1B).

The vehicle 100 also includes a battery pack 120. For example only, the battery pack 120 may be a 48 Volt (V) direct current (DC) battery pack, although another suitable battery pack may be used. The battery pack 120 may include two or more individual batteries connected together or may include one battery. For example, in the case of a 48 V battery pack, the battery pack 120 may include four 12 V batteries connected in series. The batteries may be connected such that a lower voltage, such as 12 V, 24 V, and/or 36 V can also be obtained from one, two, or three of the batteries.

Figure 2A:
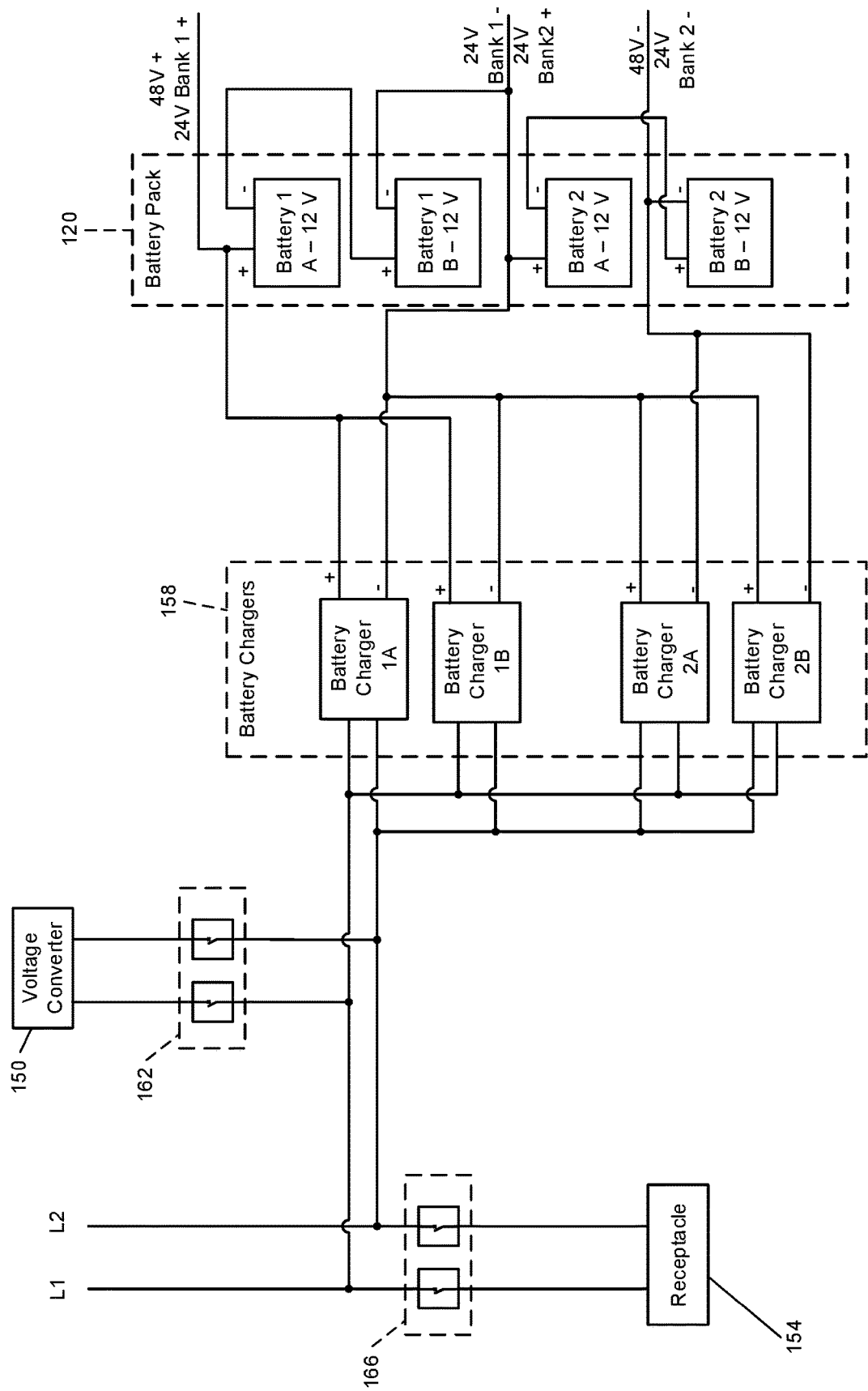
FIGS. 2A and 2B are schematics including a battery pack for a refrigeration system of a vehicle and example charging systems for charging the battery pack.
Figure 2B:
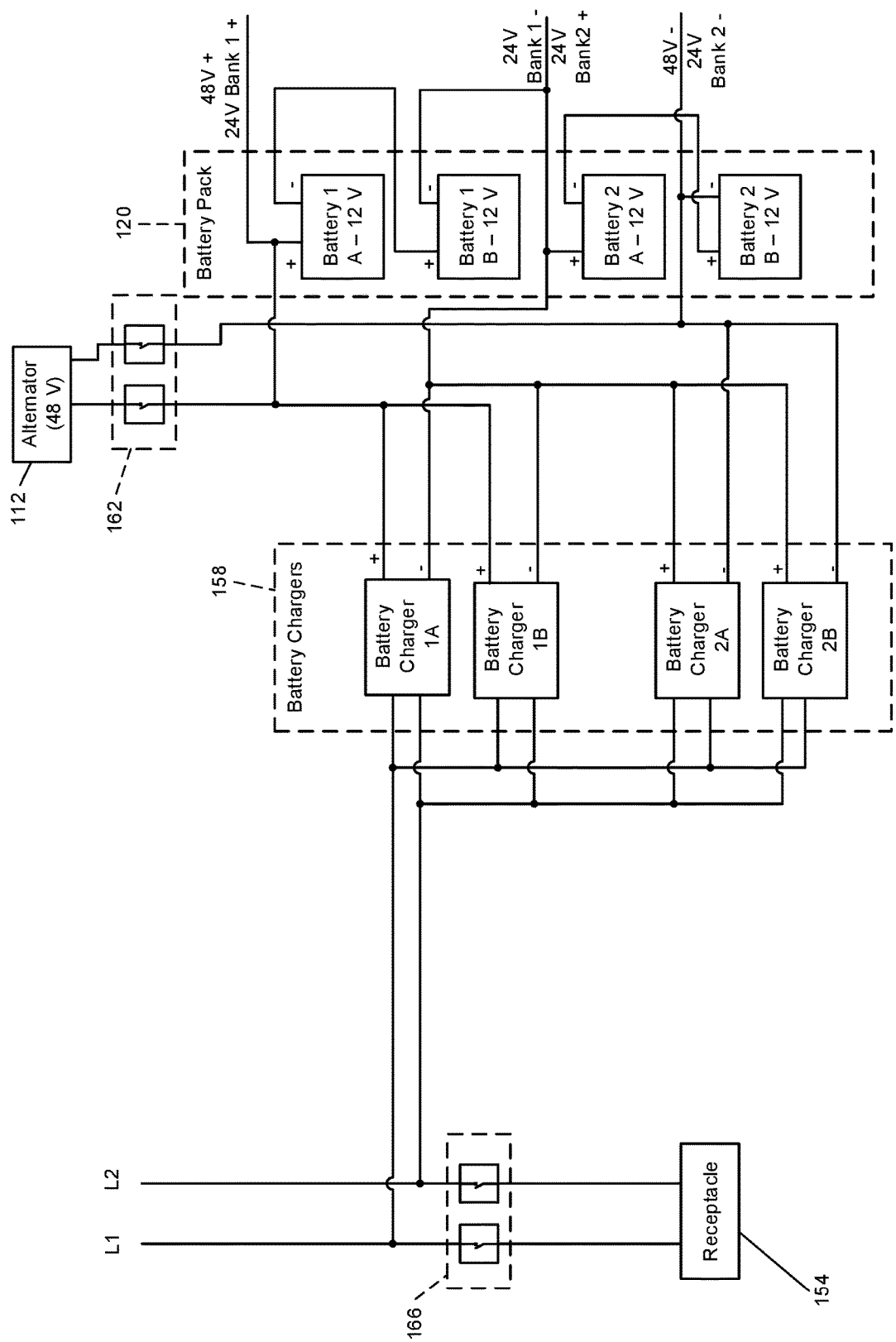

FIGS. 2A and 2B are schematics including examples of the battery pack 120 for a refrigeration system of a vehicle and example charging systems. In the examples of FIGS. 2A and 2B, the battery pack 120 includes four individual 12 V batteries connected in series. The batteries are arranged in two banks (A and B), each bank having two individual 12 V batteries (batteries 1 and 2) connected in series, to provide two 24 V reference potentials.

Referring back to FIGS. 1A and 1B, the battery pack 120 supplies power to a refrigeration system 124. The refrigeration system 124 cools a refrigerated space 128. The refrigeration system 124 includes a drive 127 with EMI and transient protection circuits 129. Examples of the EMI and transient protection circuits 129 are shown in FIG. 7.

The refrigerated space 128 may be one refrigerated space that is cooled based on a setpoint temperature. Alternatively, the refrigerated space 128 may be divided (e.g., physically) into multiple refrigerated spaces that may be cooled based on respective setpoint temperatures. For example, a first portion of the refrigerated space 128 may be cooled based on a first setpoint temperature (e.g., for refrigerated items) and a second portion of the refrigerated space 128 may be cooled based on a second setpoint temperature (e.g., for frozen items) that is less than the first setpoint temperature. One example of such a vehicle includes a truck for transporting perishable food items between locations. The refrigerated space(s) may be cooled with a closed loop control system based on temperature(s) within the refrigerated space(s) and the set point temperature(s), respectively.

The vehicle 100 includes a door 132 that provides access to the refrigerated space 128, for example, for loading and unloading of contents of the refrigerated space 128. While the example of one door is provided, the vehicle 100 may include two or more doors. Some vehicles include fourteen (14) or more doors.

An unlock actuator 136 and a lock actuator 140 may unlock and lock the door 132, respectively. The unlock and lock actuators 136 and 140 may, for example, slide a pin out of and into a receiver to lock and unlock the door 132, respectively. An unlock actuator and a lock actuator may be provided with each door to the refrigerated space in various implementations.

A control module (discussed further below) of the refrigeration system 124 may actuate the unlock actuator 136 to unlock the door 132 (and the other doors to the refrigerated space 128) in response to user input to unlock doors of a passenger cabin of the vehicle 100. The control module may actuate the lock actuator 140 to lock the door 132 (and the other doors to the refrigerated space 128) in response to user input to lock the doors of the passenger cabin of the vehicle 100. User input to lock and unlock the doors of the passenger cabin may be provided, for example, via a wireless key fob, a mobile device (e.g., cell phone, tablet, or other handheld device), a remote computer system, and/or one or more lock/unlock switches accessible from within the passenger cabin of the vehicle 100.

The battery pack 120 can be charged using multiple different power sources. For example, in the example of FIG. 1A, the vehicle 100 includes a voltage converter 150 that converts power output by the electrical source 112 (e.g., 12 V) into power for charging the battery pack 120. The voltage converter 150 may convert the DC output of the electrical source 112 into, for example, 240 V alternating current (AC). Since the electrical source 112 is driven by rotation of the engine 104, the electrical source 112 may be used to charge the battery pack 120 when the engine 104 is running.

While the electrical source 112 is shown as providing power for charging both the battery 116 and the battery pack 120, a second electrical source may be used to convert power of the engine 104 into electrical power for the battery pack 120. In that case, the electrical source 112 may be used to charge the battery 116. In various implementations, the voltage converter 150 and a switch 162 may be omitted, and the engine 104 may not be used to charge the battery pack 120. The battery pack 120 may instead be charged via one or more other power sources, such as those discussed further below.

As another example, in the example of FIG. 1B, the electrical source 112 may charge the battery pack 120. In this example, a voltage converter 152 may convert the power output by the electrical source 112 (e.g., 48 V) into power for charging the battery 116. The voltage converter 152 may convert the DC output of the electrical source 112 into, for example, 12 V for the battery 116. Alternatively, however, another electrical source may be used to charge the battery 116. In various implementations, an (engine driven) electrical source for charging the battery pack 120 may be omitted. The battery pack 120 may be charged from the drive 127 using one of the phases of a converter 155, which may be an AC-to-DC converter or a DC-to-DC converter. The battery pack 120 may alternatively be charged via a transformer if isolation is required.

The battery pack 120 can be charged using power from a utility received via a receptacle 154. The receptacle 154 is configured to receive AC or DC power. For example, the receptacle 154 may receive AC power from a utility via a power cord (e.g., an extension cord) connected between the receptacle 154 and a wall outlet or charger of a building. The receptacle 154 may be, for example, a single phase 110/120 or 208/240 V AC receptacle, a 3-phase 208/240 V AC receptacle, or a three phase 380-480 VAC receptacle. In various implementations, the vehicle 100 may include both a 110/120 V AC receptacle and a 208/240 V AC receptacle. While the example of the receptacle 154 receiving AC power is provided, the receptacle 154 may alternatively receive DC power from via a power cord. In various implementations, the vehicle 100 may include one or more AC receptacles and/or one or more DC receptacles. Power received from a utility via the receptacle 154 will be referred to as shore power.

Power from the receptacle 154 may be provided to the drive 127. The drive 127 may include the converter 155. When implemented as an AC-to-DC converter, the converter 155 may include a rectifier and supply DC power to the EMI and transient protection circuits 129. In one embodiment, the drive 127 receives power from the voltage converter 176, which may be supplied to the converter 155. In this example, the converter 155 is implemented as a DC-to-DC converter.

The vehicle 100 also includes one or more battery chargers 158. The battery chargers 158 charge the batteries of the battery pack 120 using shore power received via the receptacle 154 (or power output by the voltage converter 150 in the examples of FIGS. 1A and 2A). When the receptacle 154 is connected to shore power, the switch 162 opens (or is opened) to isolate power from the electrical source 112. While the switch 162 is shown illustratively as one switch, the switch 162 may include one, two, or more than two switching devices (e.g., normally closed or normally open relays). In the examples of FIGS. 2A and 2B, the switch 162 is illustrated as including two relays, one relay for each power line. The battery pack 120 may also be charged from the drive 127 without use of the voltage converters 152, 158. For example, the drive 127 may perform AC-to-DC and/or DC-to-DC converter functions. In one embodiment one or more of the phases of the drive 127 are used for charging the battery pack 120 while the other one or more of the phases of the drive 127 are used for driving a load, such as a compressor.

When the receptacle 154 is connected to shore power and the ignition system of the vehicle 100 is OFF, a switch 166 closes (or is closed) to relay power from the receptacle 154 to the battery chargers 158, and the battery chargers 158 charge the batteries using shore power. In one embodiment, the drive includes battery chargers, which use the same DC-to-DC input of the drive and are operated as a buck converter with power coming in from the shore power input to the drive. While the switch 166 is also shown illustratively as one switch, the switch 166 may include one, two, or more than two switching devices (e.g., normally closed or normally open relays). In the example of FIGS. 2A and 2B, the switch 166 is illustrated as including two relays, one relay for each power line.

When the ignition system of the vehicle 100 is ON, the switch 166 may isolate the receptacle 154 from the battery chargers 158. Since the drive has both a shore power input and an input from the alternator, the drive may run the compressor from shore power in parallel with taking power from the alternator thereby reducing the load on the alternator. In the examples of FIGS. 1A and 2A, when the ignition system of the vehicle 100 is ON (such that the engine 104 is running and the voltage converter 150 is outputting power to charge the battery pack 120), the switch 162 connects the voltage converter 150 to the battery chargers 158. The battery chargers 158 can then charge the batteries of the battery pack 120 using power output by the voltage converter 150. In the examples of FIGS. 1B and 2B, when the ignition system of the vehicle 100 is ON (such that the engine 104 is running and the electrical source 112 is outputting power), the switch 162 connects the electrical source 112 to the battery pack 120 so the electrical source 112 charges the battery pack 120.

One battery charger may be provided for each battery of the battery pack 120. Two or more battery chargers may be connected in series and/or parallel in various implementations. Each battery charger may convert input power (e.g., shore power or power output by the voltage converter 150) into, for example, 24 V, 40 amp (A) DC power for charging. For example only, the battery chargers 158 may include one model SEC-2440 charger, manufactured by Samlex America Inc., of Burnaby, BC, Canada. In the examples of FIGS. 2A and 2B, two groups of two 24 V, 40 A battery chargers are connected to provide a 48 V, 80 A output for battery charging. While the example of battery chargers having a 24 V, 40 A output is provided, battery chargers having another output may be used, such as one 12 V charger connected to each battery. The battery chargers 158 may also monitor the individual batteries and control application of power to the respective batteries to prevent overcharging.

The vehicle 100 may optionally include a solar panel (or solar panel array) 172 (hereinafter referred to as the "solar panel 172"). The solar panel 172 converts solar energy into electrical energy. While the example of one solar panel is provided, multiple solar panels may be used. A voltage converter 176 converts power output by the solar panel 172 and charges the battery pack 120. In some embodiments, the solar panel 172 and/or other solar power source(s) may be used to charge the battery pack 120 during operation in the various power modes described herein.

As discussed further below, the refrigeration system 124 includes one or more eutectic plates. The eutectic plate(s) are cooled when the vehicle 100 is connected to shore power. When the vehicle 100 is later disconnected from shore power (e.g., for delivery of contents of the refrigerated space 128), the eutectic plate(s) can be used to cool the refrigerated space 128 via power from the battery pack 120.

The eutectic plate(s) can also be cooled by the refrigeration system 124 when the vehicle 100 is disconnected from shore power.

By charging the battery pack 120 when the vehicle 100 is connected to shore power (and/or via the solar panel 172), use of the engine 104 to generate power to operate the refrigeration system 124 when the vehicle 100 is disconnected from shore power may be minimized or eliminated. This may decrease fuel consumption (and increase fuel efficiency) of the engine 104 and the vehicle 100.

A defrost device 180 may be used to defrost the eutectic plate(s) when the vehicle 100 is connected to shore power. One example of the defrost device 180 includes a resistive heater that warms air circulated over, around, and/or through the eutectic plate(s), such as by one or more fans. Another example of the defrost device 180 includes a resistive heater that warms a fluid (e.g., a glycol solution) that is circulated over, around, and/or through the eutectic plate(s), such as by one or more pumps. In this way, heat from the warm air or warm fluid defrosts the eutectic plate(s).

Figure 3:
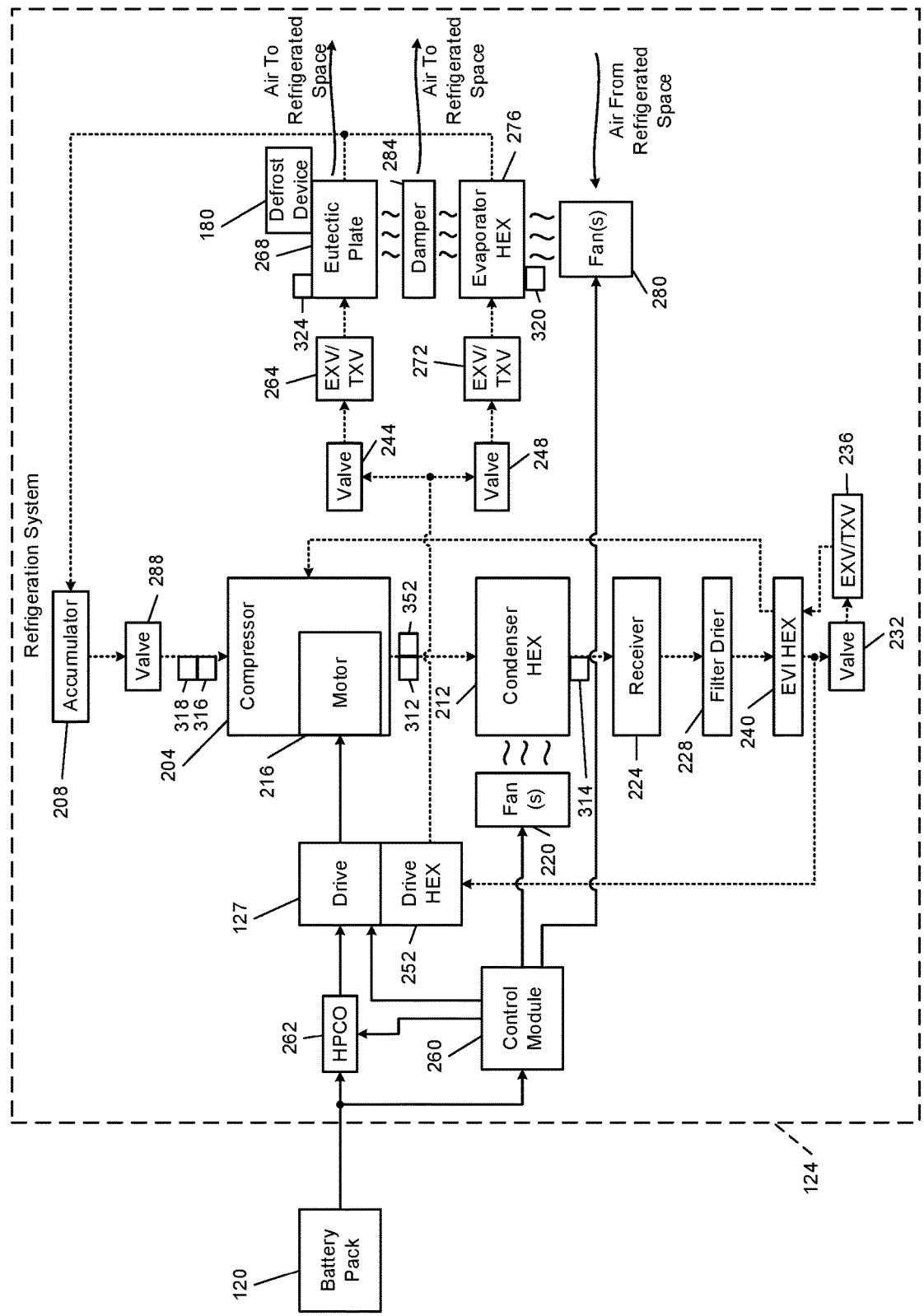
FIG. 3 is a functional block diagram of an example implementation of a refrigeration system of a vehicle including one of the drives of FIGS. 1A and 1B, a eutectic plate and an evaporator system. The term "eutectic plate" may include a single plate or multiple plates assembled into a plate bank and referenced as such from this point forward.

FIG. 3 includes a functional block diagram of an example implementation of the refrigeration system 124. In the example of FIG. 3, dotted lines indicate refrigerant flow, while solid lines indicate electrical connections. In various implementations, some, all, or none of the components of the refrigeration system 124 may be located within the refrigerated space 128.

A compressor 204 receives refrigerant vapor from an accumulator 208 via a suction line of the compressor 204. The accumulator 208 collects liquid refrigerant to minimize liquid refrigerant flow to the compressor 204. The compressor 204 compresses the refrigerant and provides pressurized refrigerant in vapor form to a condenser heat exchanger (HEX) 212. The compressor 204 includes an electric motor 216 that drives a pump to compress the refrigerant. For example only, the compressor 204 may include a scroll compressor, a reciprocating compressor, or another type of refrigerant compressor. The electric motor 216 may include, for example, an induction motor, a permanent magnet motor (brushed or brushless), or another suitable type of electric motor. In various implementations, the electric motor 216 may be a brushless permanent magnet (BPM) motor, for example, due to BPM motors being more efficient than other types of electric motors.

All or a portion of the pressurized refrigerant is converted into liquid form within the condenser HEX 212. The condenser HEX 212 transfers heat away from the refrigerant, thereby cooling the refrigerant. When the refrigerant vapor is cooled to a temperature that is less than a saturation temperature of the refrigerant, the refrigerant transitions into liquid (or liquefied) form. One or more condenser fans 220 may be implemented to increase airflow over, around, and/or through the condenser HEX 212 and increase the rate of heat transfer away from the refrigerant.

Refrigerant from the condenser HEX 212 is delivered to a receiver 224. The receiver 224 may be implemented to store excess refrigerant. In various implementations, the receiver 224 may be omitted. A filter drier 228 may be implemented to remove moisture and debris from the refrigerant. In various implementations, the filter drier 228 may be omitted.

When an enhanced vapor injection (EVI) valve 232 is open, a portion of the refrigerant may be expanded to vapor form by an expansion valve 236 and provided to an EVI HEX 240. The EVI valve 232 may be, for example, a solenoid valve or another suitable type of valve.

The EVI HEX 240 may be a counter flow plate HEX and may superheat the vapor refrigerant from the EVI valve 232. Vapor refrigerant from the EVI HEX 240 may be provided to the compressor 204, such as at a midpoint within a compression chamber of the compressor 204. EVI may be performed, for example, to increase capacity and increase efficiency of the refrigeration system 124. The EVI valve 232 may include a thermostatic expansion valve (TXV) or an electronic expansion valve (EXV).

The refrigerant not flowing through the EVI valve 232 is circulated to a plate control valve 244 and an evaporator control valve 248. The plate control valve 244 may be, for example, a solenoid valve or another suitable type of valve. The evaporator control valve 248 may be, for example, a solenoid valve or another suitable type of valve.

Before flowing to the plate control valve 244 and the evaporator control valve 248, the refrigerant may flow through a drive HEX 252. The drive HEX 252 draws heat away from the drive 127 and transfers heat to refrigerant flowing through the drive HEX 252. While the example of the drive HEX 252 being liquid (refrigerant) cooled is provided, the drive 127 may additionally or alternatively be air cooled. Air cooling may be active (e.g., by a fan) or passive (e.g., by conduction and convection).

The drive 127 controls application of power to the motor 216 from the battery pack 120. For example, the drive 127 may control application of power to the motor 216 based on a speed command from a control module 260. Based on the speed command, the drive 127 may generate three-phase AC power (e.g., 208/240 V AC) and apply the three-phase AC power to the motor 216. The drive 127 may set one or more characteristics of the three-phase AC power based on the speed command, such as frequency, voltage, and/or current. For example only, the drive 127 may be a variable frequency drive (VFD). In various implementations, one or more electromagnetic interference (EMI) filters may be implemented between the battery pack 120 and the drive 127. In one embodiment, the motor 216 is an induction motor or a permanent magnet motor.

The control module 260 may set the speed command to multiple different possible speeds for variable speed operation of the motor 216 and the compressor 204. The control module 260 and the drive 127 may communicate, for example, using RS485 Modbus or another suitable type of communication including, but not limited to, controller area network (CAN) bus or analog signaling (e.g., 0-10V signals).

A high pressure cut off (HPCO) 262 may be implemented to disconnect the drive 127 from power and disable the motor 216 when the pressure of refrigerant output by the compressor 204 exceeds a predetermined pressure. The control module 260 may also control operation of the compressor 204 based on a comparison of the pressure of refrigerant output by the compressor 204. For example, the control module 260 may shut down or reduce the speed of the compressor 204 when the pressure of refrigerant output by the compressor is less than a second predetermined pressure that is less than or equal to the predetermined pressure used by the HPCO 262.

When the plate control valve 244 is open, refrigerant may be expanded to vapor form by an expansion valve 264 and provided to one or more eutectic plate(s) 268. The vapor refrigerant cools the eutectic plate(s) 268 and a solution within the eutectic plate(s) 268. For example only, the solution may be a solution including one or more salts. The solution may have a freezing point temperature of, for example, approximately 12 degrees Fahrenheit or another suitable freezing point temperature. The solution of the eutectic plate(s) 268 may be selected, for example, based on the items typically cooled within the refrigerated space 128. The expansion valve 264 may include a TXV or may be an EXV.

The eutectic plate(s) 268 is located within the refrigerated space 128 and cools the refrigerated space 128. By freezing the solution within the eutectic plate 268(s), the eutectic plate 268 can be used to cool the refrigerated space for a period of time after the freezing, such as while the vehicle 100 is transporting items within the refrigerated space 128.

When the evaporator control valve 248 is open, refrigerant may be expanded to vapor form by an expansion valve 272 and provided to an evaporator HEX 276. The expansion valve 272 may include a TXV or may be an EXV. Like the eutectic plate(s) 268, the evaporator HEX 276 cools the refrigerated space 128. More specifically, the vapor refrigerant within the evaporator HEX 276 transfers heat away (i.e., absorbs heat) from air within the refrigerated space 128.

One or more evaporator fans 280 may draw air from the refrigerated space 128. The evaporator fan(s) 280 may increase airflow over, around, and/or through the evaporator HEX 276 and the eutectic plate(s) 268 to increase the rate of heat transfer away from (i.e., cooling of) the air within the refrigerated space 128. A damper door 284 may be implemented to allow or block airflow from the evaporator fan(s) 280 to the eutectic plate(s) 268. For example, when the damper door 284 is open, the evaporator fan(s) 280 may circulate air past the evaporator HEX 276 and the eutectic plate(s) 268. When the damper door 284 is closed, the damper door 284 may block airflow from the evaporator fan(s) 280 to the eutectic plate(s) 268, and the evaporator fan(s) 280 may circulate air over, around, and/or through the evaporator HEX 276. While the example of the damper door 284 is provided, another suitable actuator may be used to allow/prevent airflow from the evaporator fan(s) 280 to the eutectic plate(s) 268. Alternatively, one or more fans may be provided with the evaporator HEX 276, and one or more fans may be provided with the eutectic plate(s) 268. Refrigerant flowing out of the eutectic plate(s) 268 and the evaporator HEX 276 may flow back to the accumulator 208. Air cooled by the evaporator HEX 276 and the eutectic plate(s) 268 flows to the refrigerated space to cool the refrigerated space 128. While separate cooled air paths are illustrated in the example of FIG. 3, air flowing out of the eutectic plate(s) 268 may be combined with air flowing out of the evaporator HEX 276 before the cooled air is output to cool the refrigerated space 128. Curved lines in FIG. 3 are illustrative of air flow.

The refrigeration system 124 may also include a compressor pressure regulator (CPR) valve 288 that regulates pressure of refrigerant input to the compressor 204 via the suction line. For example, the CPR valve 288 may be closed to limit pressure into the compressor 204 during startup of the compressor 204. The CPR valve 288 may be an electronically controlled valve (e.g., a stepper motor or solenoid valve), a mechanical valve, or another suitable type of valve. In various implementations, the CPR valve 288 may be omitted. In one embodiment, the CPR valve 288 is not included. The CPR valve 288 may be used to limit startup torque of the motor of the compressor 204. The drive 127 limits the torque the motor can pull.

Figure 4A:
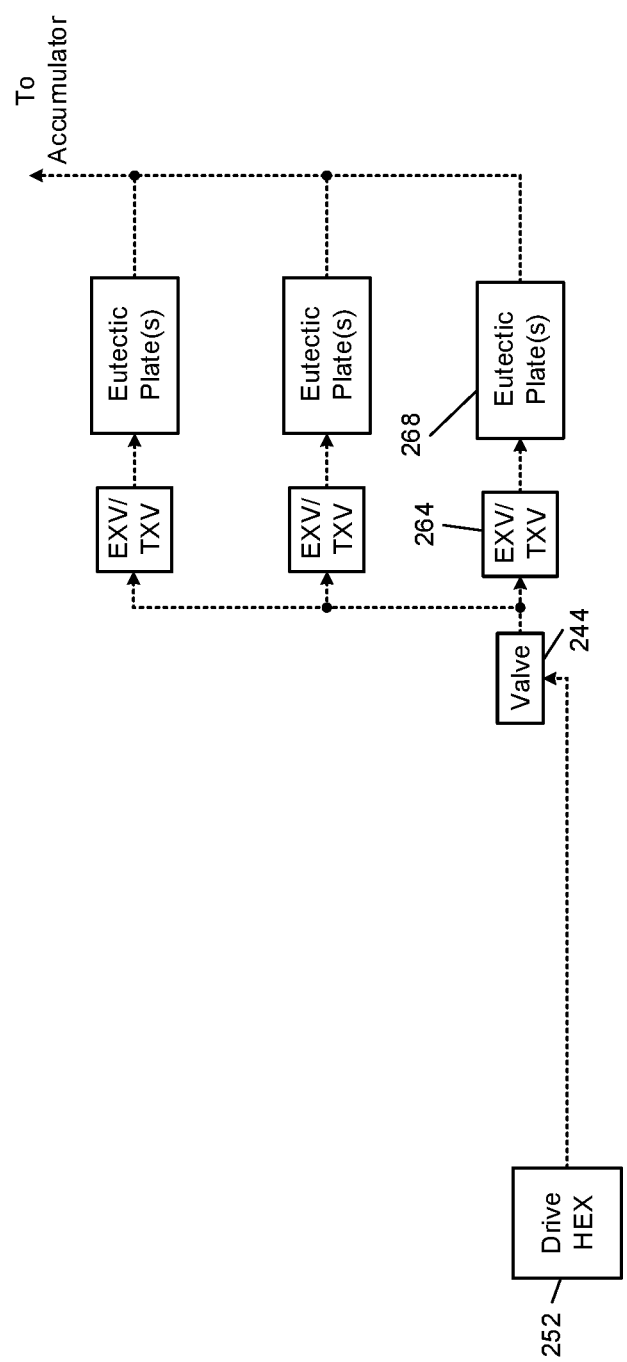
FIG. 4A includes a functional block diagram of a portion of an example refrigeration system including multiple eutectic plates.

The example of one eutectic plate and one evaporator HEX is provided in FIG. 3. However, the refrigeration system 124 may include more than one eutectic plate, such as two, three, four, five, six, or more eutectic plates. One expansion valve may be provided for each eutectic plate. FIG. 4A includes a functional block diagram of a portion of an example refrigeration system including multiple eutectic plates.

Figure 4B:
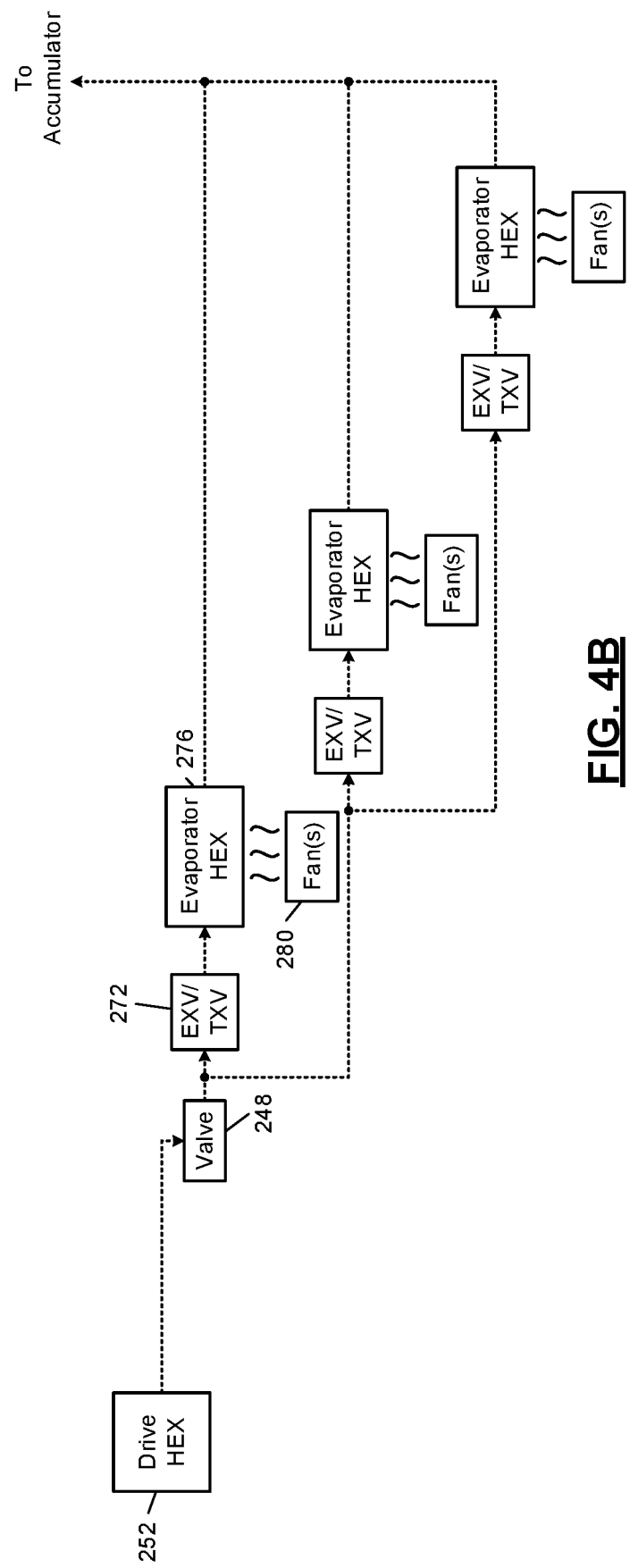
FIG. 4B includes a functional block diagram of a portion of an example refrigeration system including multiple evaporator systems.

Additionally or alternatively to having one or multiple eutectic plates, the refrigeration system 124 may include more than one evaporator HEX, such as two, three, four, five, six, or more evaporator HEXs. For example, different evaporator HEXs may be provided for different sections of the refrigerated space 128. One expansion valve and one or more evaporator fans may be provided for each evaporator HEX. FIG. 4B includes a functional block diagram of a portion of an example refrigeration system including three evaporator HEXes.

Some vehicles may include two or more refrigerated spaces, but only include an evaporator (or multiple) and a eutectic plate (or multiple) in one of the refrigerated spaces. A damper door or another suitable actuator may be provided to open and close the one refrigerated space having the evaporator and eutectic plate to and from one or more other refrigerated spaces not having an evaporator or a eutectic plate (i.e., not having any evaporators and not having any eutectic plates). The control module 260 may control opening and closing of such a damper door or actuator, for example, based on maintaining a temperature within the other refrigerated space based on a setpoint for that other refrigerated space.

Figure 5:
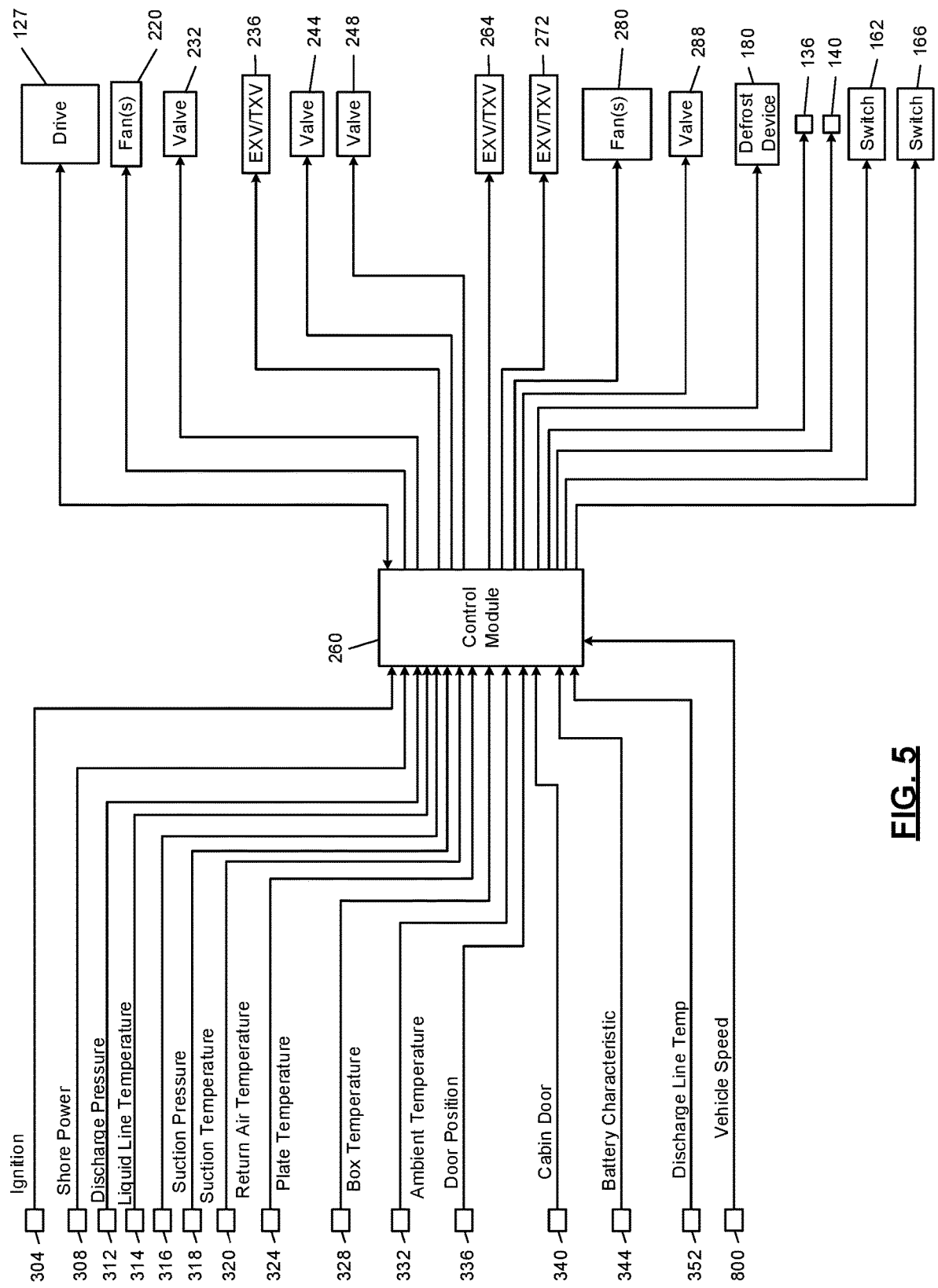
FIG. 5 includes a functional block diagram of an example system including a control module, sensors of the vehicle, and actuators of the vehicle.

FIG. 5 includes a functional block diagram of an example system including the control module 260, various sensors of the vehicle 100, and various actuators of the vehicle 100. The control module 260 receives various measured parameters and indications from sensors of the vehicle 100. The control module 260 controls actuators of the vehicle 100. As an example, the control module 260 may be an iPRO series control module (e.g., 100 series, 200 series, 4 DIN series, 10 DIN series) by Dixell S.r.l., located in Pieve d'Alpago Belluno (BL) Italy. One example is an iPRO IPG115D control module, however, the control module 260 may be another suitable type of control module.

An ignition sensor 304 indicates whether an ignition system of the vehicle 100 is ON or OFF. A driver may turn the ignition system of the vehicle 100 ON and start the engine 104, for example, by actuating an ignition key, button, or switch. The ignition system being ON may indicate that that a refrigeration system (discussed further below) is being or can be powered via a charging system powered by the engine 104. A driver may turn the ignition system of the vehicle 100 OFF and shut down the engine 104, for example, by actuating the ignition key, button, or switch.

A shore power sensor 308 indicates whether the vehicle 100 is receiving shore power via the receptacle 154.

A discharge pressure sensor 312 measures a pressure of refrigerant output by the compressor 204 (e.g., in the discharge line). The pressure of refrigerant output by the compressor 204 can be referred to as discharge pressure.

A liquid line temperature sensor 314 measures a temperature of liquid refrigerant output from the condenser HEX 212 (e.g., in the liquid line). The temperature of refrigerant output by the condenser HEX 212 can be referred to as liquid line temperature. The control module 260 may determine a subcooling value based on the liquid line temperature. The control module may determine a refrigerant charge level based on the subcooling value. While one example location of the liquid line temperature sensor 314 is shown, the liquid line temperature sensor 314 may be located at another location where liquid refrigerant is present in the refrigerant path from the condenser HEX 212 to the evaporator HEX 276 (and the eutectic plate 324).

A suction pressure sensor 316 measures a pressure of refrigerant input to the compressor 204 (e.g., in the suction line). The pressure of refrigerant input to the compressor 204 can be referred to as suction pressure.

A suction temperature sensor 318 measures a temperature of refrigerant input to the compressor 204 (e.g., in the suction line). The temperature of refrigerant input to the compressor 204 can be referred to as suction temperature. The control module 260 may determine a superheat value at the compressor 204. The control module 260 may detect and/or predict the presence of a liquid floodback condition based on the superheat value.

A return air temperature sensor 320 measures a temperature of air input to the evaporator HEX 276. The temperature of air input to the evaporator HEX 276 can be referred to as return air temperature (RAT). One return air temperature sensor may be provided for each set of one or more evaporator HEX and one or more eutectic plates.

A plate temperature sensor 324 measures a temperature of the eutectic plate(s) 268. The temperature of the eutectic plate(s) 268 can be referred to as a plate temperature.

A box temperature sensor 328 measures a temperature within the refrigerated space 128. The temperature within the refrigerated space 128 can be referred to as a box temperature. One or more box temperature sensors may be provided and measure a box temperature within each different portion of the refrigerated space 128.

An ambient temperature sensor 332 measures a temperature of ambient air at the location of the vehicle 100. This temperature can be referred to as ambient air temperature. In various implementations, the control module 260 may receive the ambient air temperature from an engine control module (ECM) that controls actuators of the engine 104.

A door position sensor 336 indicates whether the door 132 is closed or open. An indication that the door 132 is open may mean that the door 132 is at least partially open (i.e., not closed), while an indication that the door 132 is closed may mean that the door 132 is fully closed. One or more door position sensors may be provided for each door to the refrigerated space 128.

A cabin door sensor 340 indicates whether the doors of the passenger cabin have been commanded to be locked or unlocked. A driver may command unlocking and locking of the doors of the passenger cabin, for example, via a wireless key fob. As discussed above, the control module 260 may actuate the unlock actuator 136 to unlock the door(s) to the refrigerated space 128 when the driver commands unlocking of the doors passenger cabin. The control module 260 may actuate the lock actuator 140 to lock the door(s) to the refrigerated space 128 when the driver commands locking of the doors of the passenger cabin.

A battery sensor 344 measures a characteristic of a battery of the battery pack 120, such as voltage, current, and/or temperature. In various implementations, a voltage sensor, a current sensor, and/or a temperature sensor may be provided with each battery of the battery pack 120.

A discharge line temperature sensor 352 measures a temperature of refrigerant output by the compressor 204 (e.g., in the discharge line). The temperature of refrigerant output by the compressor 204 can be referred to as discharge line temperature (DLT). In various implementations, the discharge line temperature sensor 352 may provide the DLT to the drive 127, and the drive 127 may communicate the DLT to the control module 260.

Sensors described herein may be analog sensors or digital sensors. In the case of an analog sensor, the analog signal generated by the sensor may be sampled and digitized (e.g., by the control module 260, the drive 127, or another control module) to generate digital values, respectively, corresponding to the measurements of the sensor. In various implementations, the vehicle 100 may include a combination of analog sensors and digital sensors. For example, the ignition sensor 304, the shore power sensor 308, the door position sensor 336 may be digital sensors. The discharge pressure sensor 312, the suction pressure sensor 316, the return air temperature sensor 320, the plate temperature sensor 324, the box temperature sensor 328, the ambient temperature sensor 332, the battery sensor 344, and the discharge line temperature sensor 352 may be analog sensors.

As discussed further below, the control module 260 controls actuators of the refrigeration system 124 based on various measured parameters, indications, setpoints, and other parameters.

For example, the control module 260 may control the motor 216 of the compressor 204 via the drive 127. The control module 260 may control the condenser fan(s) 220. The condenser fan(s) 220 may be fixed speed, and the control module 260 may control the condenser fan(s) 220 to be either ON or OFF. Alternatively, the condenser fan(s) 220 may be variable speed, and the control module 260 may determine a speed setpoint for the condenser fan(s) 220 and control the condenser fan(s) 220 based on the speed setpoint, for example, by applying a pulse width modulation (PWM) signal to the condenser fan(s) 220.

The control module 260 may also control the EVI valve 232. For example, the control module 260 may control the EVI valve 232 to be open to enable EVI or closed to disable EVI. In the example of the expansion valve 236 being an EXV, the control module 260 may control opening of the expansion valve 236.

The control module 260 may also control the plate control valve 244. For example, the control module 260 may control the plate control valve 244 to be open to enable refrigerant flow through the eutectic plate(s) 268 or closed to disable refrigerant flow through the eutectic plate(s) 268. In the example of the expansion valve 264 being an EXV, the control module 260 may control opening of the expansion valve 264.

The control module 260 may also control the evaporator control valve 248. For example, the control module 260 may control the evaporator control valve 248 to be open to enable refrigerant flow through the evaporator HEX 276 or closed to disable refrigerant flow through the evaporator HEX 276. In the example of the expansion valve 272 being an EXV, the control module 260 may control opening of the expansion valve 272.

The control module 260 may receive a signal that indicates whether the HPCO 262 has tripped (open circuited). The control module 260 may take one or more remedial actions when the HPCO 262 has tripped, such as closing one, more than one, or all of the above mentioned valves and/or turning OFF one, more than one, or all of the above mentioned fans. The control module 260 may generate an output signal indicating that the HPCO 262 has tripped when the discharge pressure of the compressor 204 is greater than a predetermined pressure. The control module 260 may enable operation of the refrigeration system 124 after the HPCO 262 closes in response to the discharge pressure falling below than the predetermined pressure. In various implementations, the control module 260 may also require that one or more operating conditions be satisfied before enabling operation of the refrigeration system 124 after the HPCO 262 closes.

The control module may control the evaporator fan(s) 280. The evaporator fan(s) 280 may be fixed speed, and the control module 260 may control the evaporator fan(s) 280 to be either ON or OFF. Alternatively, the evaporator fan(s) 280 may be variable speed, and the control module 260 may determine a speed setpoint for the evaporator fan(s) 280 and control the evaporator fan(s) 280 based on the speed setpoint, for example, by applying a PWM signal to the evaporator fan(s) 280.

In the case of the CPR valve 288 being used and being an electronic CPR valve, the control module 260 may also control the CPR valve 288. For example, the control module 260 may actuate the CPR valve 288 to limit the suction pressure during startup and later open the CPR valve 288.

The control module 260 may also control operation of the defrost device 180 by activating or deactivating the defrost device 180.

The control module 260 may also control the switches 162 and 166. For example, the control module 260 may switch the switch 162 from the closed state to the open state and switch the switch 166 from the open state to the closed state when the ignition system of the vehicle 100 is OFF and shore power is connected to the vehicle 100 via the receptacle 154. The control module 260 may switch the switch 162 from the open state to the closed state and switch the switch 166 from the closed state to the open state when the ignition system of the vehicle 100 is ON. This may be the case regardless of whether shore power is or is not connected to the vehicle 100. The switches 162 and 166 may be active switches, for example, so the control module 260 can ensure that both switches 162 and 166 are not both in the closed state at the same time.

In various implementations, the switches 162 and 166 may be passive devices configured to have opposite open and closed states based on whether shore power is connected to the vehicle 100. For example, the switch 166 may transition to the closed state and the switch 162 may transition to the open state when shore power is connected to the vehicle 100. The switch 166 may transition to the open state and the switch 162 may transition to the closed state when shore power is not connected to the vehicle 100.

Figure 6A:
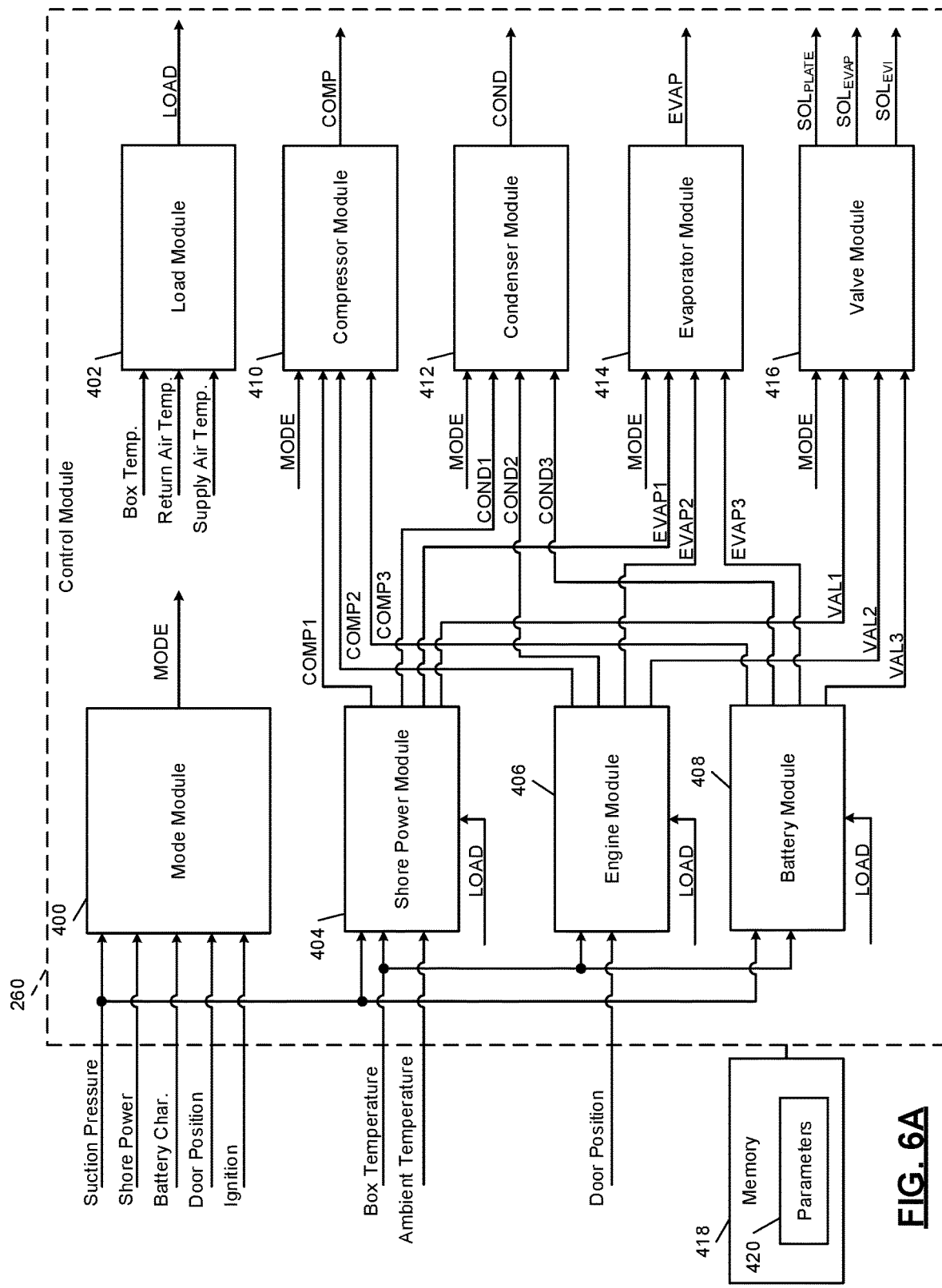
FIG. 6A is a functional block diagram of an example of the control module.

FIG. 6A shows an example of the control module 260, which includes a mode module 400, a load module 402, a shore power module 404, an engine module 406, a battery module 408, a compressor module 410, a condenser module 412, an evaporator module 414 and a valve module 416. The modules 260, 400, 402, 404, 404, 406, 408, 410, 412, 414, 416 access data stored in a memory 418. The data includes parameters 420 detected, measured and calculated. The memory may be separate from the control module 260 and/or included in the control module 260. Operation of the modules 260, 400, 402, 404, 404, 406, 408, 410, 412, 414, 416 is described below with respect to the embodiments of FIGS. 7-12.

Figure 6B:
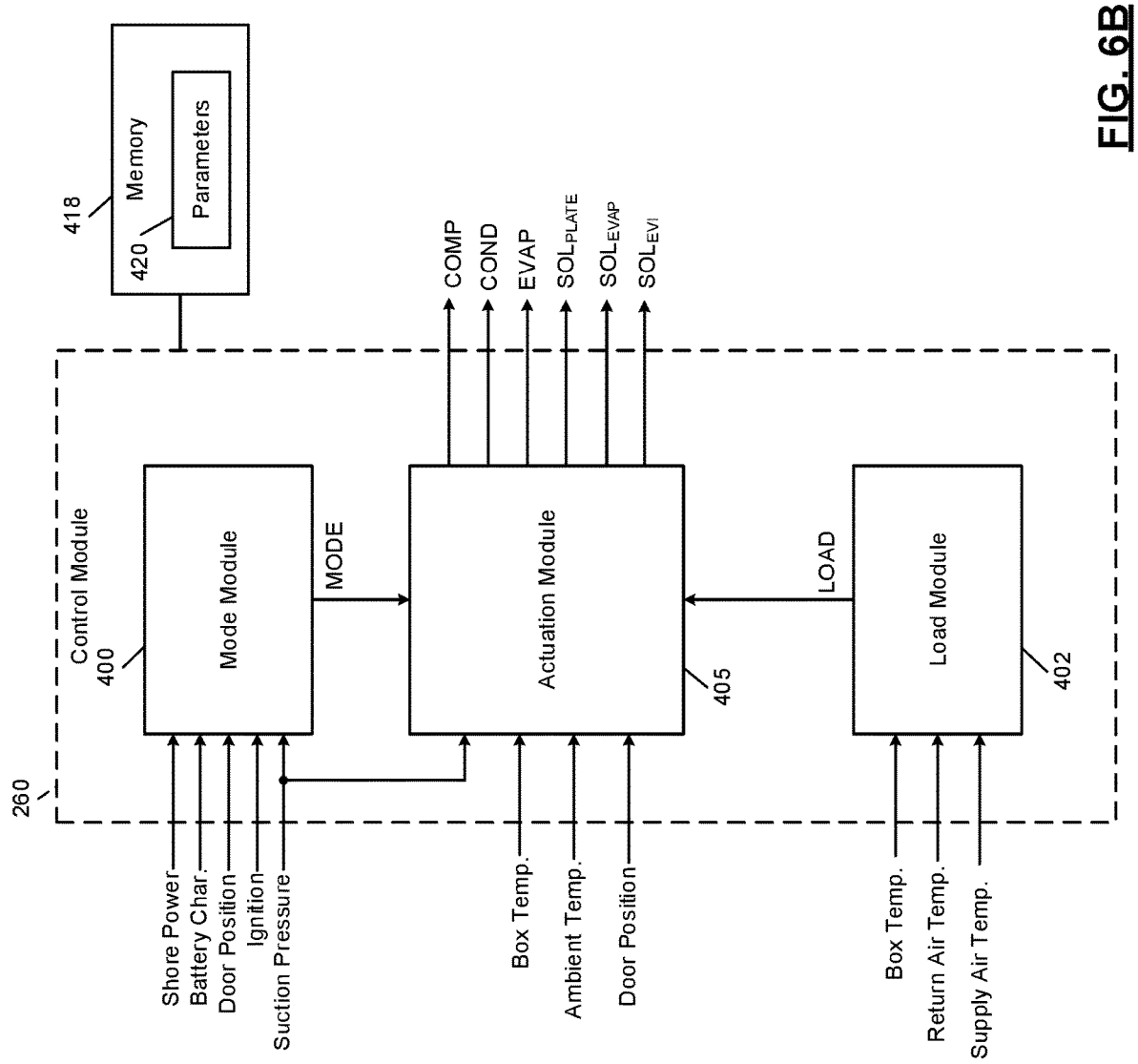
FIG. 6B is a functional block diagram of another example of the control module.

As an alternative, FIG. 6B shows another example of the control module 260, which includes the mode module 400, the load module 402, and an actuation module 405. One or more of the modules 404, 406, 408, 410, 412, and 414 of FIG. 6A may be implemented as a single module and/or circuit, as shown in FIG. 6B at 405. In this alternate embodiment, multiple compressor signals (e.g., COMP1, COMP2, COMP3), multiple condenser fan signals (e.g., COND1, COND2, COND3) and multiple evaporator fan signals EVAP1, EVAP2, EVAP3) may not be generated as shown in FIG. 6A and as described below. The actuation module 405 may generate signals COMP, COND, EVAP directly based on input parameters (e.g., suction pressure, box temperature, ambient temperature, door position, compressor load, etc.).

FIG. 7 shows the drive 127, which may receive power from a DC source 700, such as the battery pack 120 or battery chargers 158 of FIG. 1, the AC-to-DC converter 155, a rectifier connected to and/or receiving utility power, the solar panel 172, and/or other DC source. One or more of the DC sources (shown as other DC source 701) may be directly connected to and supply a DC voltage to DC bus 714. The DC source 700 may be implemented within the drive 127. The drive 127 includes a charging circuit 702, relays and switches 703, EMI and transient protection circuits 704, chokes 706, bi-directional converters 708, and an inverter 710, which outputs AC power to the compressor 204.

The charging circuit 702 may include one or more relays, a relay drive circuit, and current limiting elements (CLEs). The CLEs may include resistors, thermistors, or other current limiting elements. The charging circuit 702 controls power supplied from the DC source 700 to the EMI and transient protection circuits 704. For example, when the drive 127 initially powers up, the charging circuit 702 may place a current-limiting resistor in series between the DC source 700 and the EMI and transient protection circuits 704 to reduce the amount of current inrush. This provides protection against current or power spikes, which can cause various components to prematurely fail. The charging circuit 702 may be used to initially charge capacitors of the EMI and transient protection circuits 704 or capacitors on the DC Bus of the drive between the bi-directional converter and inverter. The charging circuit may be split into 3 separate charging circuits at the input of each transient protection and EMI circuit to reduce the current ratings of the relays and CLE's for potential cost savings.

After initial charging is completed, the charging circuit 702 may close a relay that bypasses the current-limiting resistor. For example, the control module 260 may provide a relay control signal to a relay within the charging circuit 702. In various implementations, the control module 260 may assert the relay control signal to bypass the current-limiting resistor after a predetermined period of time following start up, or based on closed loop feedback indicating that charging is near completion.

The relays and switches 703 may be included and be controlled by the control module 260. The relays and switches 703 may be operated in different states for the forward and revers modes as further described below. One or more relays and switches may be provided for each of the phases and used to direct current away from or to the DC source 700.

The EMI and transient protection circuits 704 filter out electromagnetic interference, provide transient voltage protection, provide reverse polarity protection, and provide DC-to-DC voltage conversion. An example of each of the EMI and transient protection circuits 704 is shown in FIG. 8. Although a certain number of EMI and transient protection circuits are shown for a particular number of phases of the drive 127, a different number of EMI and transient protection circuits may be included. Each of the EMI and transient protection circuits 704 may receive a same DC voltage from the charging circuit 702 and is connected to a first ground 712 (e.g., a conductive element connected to a negative battery terminal on the other side of the common mode choke 810. The point 814 is a negative battery terminal). The EMI and transient protection circuits 704 provide a first DC output to the DC bus 714 and a second DC output to chokes 706 and are connected to a second ground 716 (e.g., a reference ground or earth ground, referred to as a chassis ground). The chokes 706 may be referred to as second (or boost) chokes.

The EMI and transient protection circuits 704 reduce EMI that might otherwise be injected back onto a DC line from the drive 127. The EMI and transient protection circuits 704 may also remove or reduce EMI arriving from the DC source 700. Further, the EMI and transient protection circuits 704 protect against power surges, such as may be caused by lightening, and/or other types of power surges and sags.

Figure 9:
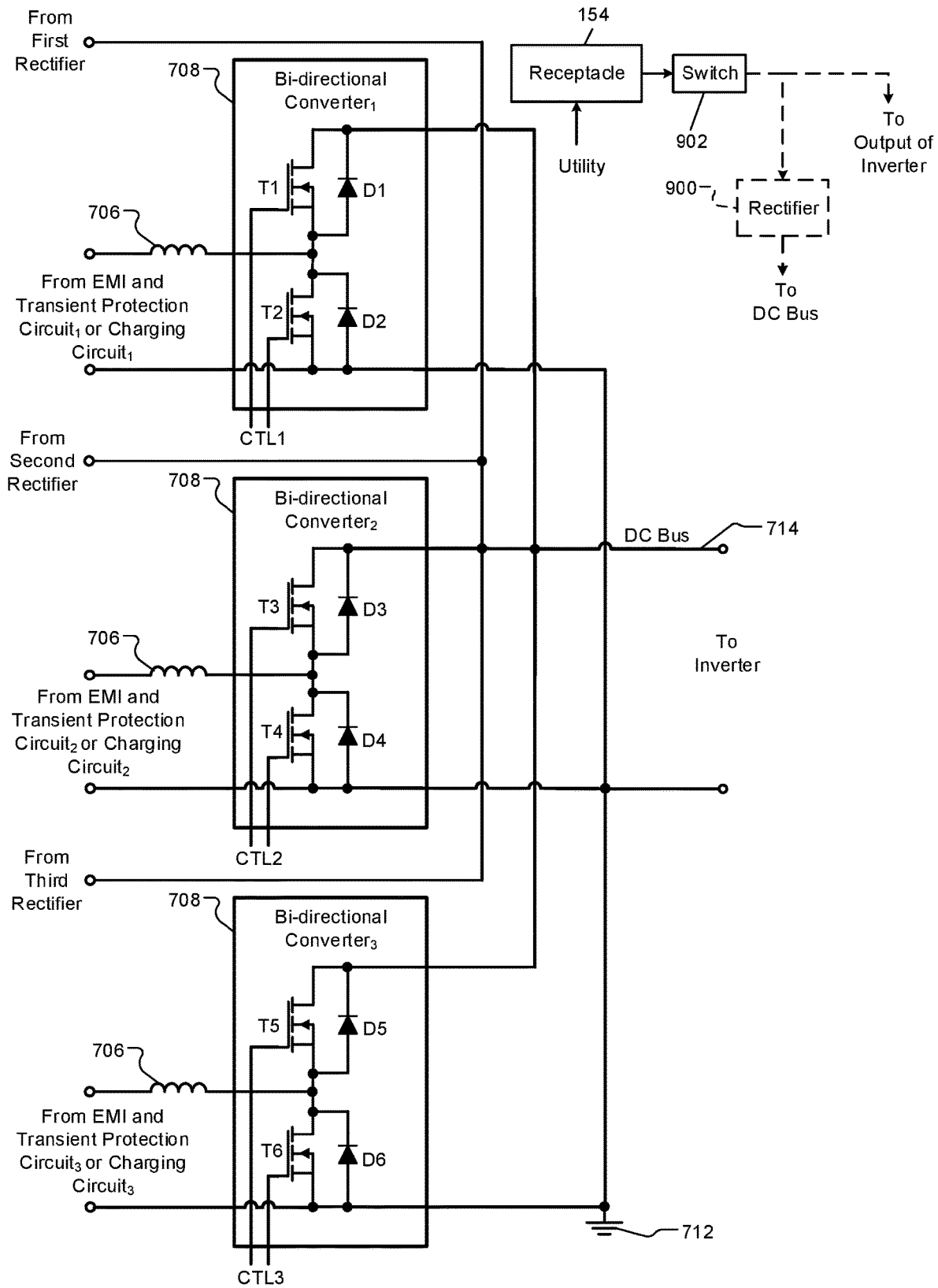
FIG. 9 is a schematic diagram of an example of the bi-directional converters of the drive of FIGS. 1A and 1B.

The chokes 706 are used to pass DC while blocking high frequency current. The bi-directional converters 708 may operate as (i) boost converters when in a forward mode and supply current to the DC bus 714, and (ii) as buck converters when operated in a reverse mode and receive current from the DC bus 714. Examples of the bi-directional converters 708 are shown in FIG. 9. In an embodiment, the number of chokes and the number of bi-direction converters is equal to the number of EMI and transient protection circuits 704. The bi-directional converters 708 may be controlled by the control module 260. The control module 260 may be implemented as part of the drive 127 or another control module may be implemented as part of the drive 127 and perform some of the operations disclosed herein as being performed by the control module 260. Outputs of the bi-directional converters 708 are connected to the DC bus 714 and the first ground 712, which in turn are connected to the inverter 710. The DC bus 714 may be connected to and/or provide power to a first one or more devices other than or in addition to the inverter 710. The inverter 710 converts DC power to AC power, which is provided to the compressor 204. The inverter 710 may be connected to and/or provide power to a second one or more devices other than or in addition to the compressor 204. The first one or more device and the second one or more devices may be disposed anywhere in the vehicle 100 of FIG. 1. The first one or more devices and the second one or more devices may include, for example, motors, fans, lights, control modules, etc. One or more additional inputs may be connected to the DC bus (e.g., a shore power input) and also power the compressor inverter and provide power to charge the batteries in the DC source.

Each phase of the drive 127 may include one of the EMI and transient protection circuits 704, one of the chokes 706 and one of the bi-directional converters 708. Each of the phases may be operated in a forward to supply power to one or more loads (e.g. the compressor 204) or in a reverse direction to charge the DC source 700. The control module 260 may control operation of the relays and/or switches 703 and the bi-directional converters 708 to control the directional of current flow and in each of the phases from either the DC power source 700 to the DC bus 714 or from the DC bus 714 to the DC power source 700. Each of the phases may be controlled independently, such that one or more of the phases is supplying power to the DC bus 714 and one or more of the phases is being used to supply power to the DC source 700 and, for example, charge batteries of the DC source 700.

FIG. 8 shows an example of one of the EMI and transient protection circuits 704 of FIG. 7, which may receive power from a charging circuit or a DC source. The shown EMI and transient protection circuit 704 includes a first diode D1, which provides reverse polarity protection followed by a damper circuit 800, which in the example shown includes a first resistor R1 in series with a first capacitor C1. An X-capacitor C2 (referred to as an across-the-line capacitor)

is connected downstream from the damper circuit 800. Metal oxide varistors (MOVs) V1, V2 and V3 are connected downstream from the X-capacitor C2 and upstream from a common mode choke 810 and provide ground surge and transient protection. Y-capacitors may be connected, for example, downstream of the MOVs V1, V2 and upstream of the MOV V3. The diode D1, the resistor R1 and capacitor C1, the X-capacitor C2, the MOVs V1 and V2, and the MOV V3 are connected in parallel and to conductive elements 812, 814. The conductive elements 812, 814 are connected to first and second (or input) legs of the common mode choke 810.

Y-capacitors C3-C10 (referred to as line-to-ground capacitors) are connected downstream of the common mode choke 810, where C3, C5, C7 and C9 are connected in series respectively with C4, C6, C8, C10 and where capacitor pairs C3-4, C5-6, C7-8, and C9-10 are connected in parallel. The capacitors C3, C5, C7, C9 are connected to a third conductive element 820, which is connected to a first output leg of the common mode choke 810. The capacitors C4, C6, C8, C10 are connected to a fourth conductive element 822, which is connected to a second output leg of the common mode choke 810. The capacitors C3-C10 are also connected to a center conductive element 824, which is connected to the earth (or chassis) ground 716. The MOVs V1, V2 are also connected to the center conductive element 824.

An X-capacitor C11 may be connected downstream of the capacitors C9, C10. The Y-capacitors C3-C10 may be connected electrically in parallel with the X-capacitor C11. The capacitors C2-C11 perform as EMI filters. MOVs V4 and V5 may be connected in series and downstream from the X-capacitor C11. The MOVs V4, V5 are connected to the center conductive element 824. The MOV V6 is connected downstream from the MOVs V4, V5. The X-capacitor C11, the MOVs V4, V5 and the MOV V6 are connected in parallel and to the conductive elements 820, 822. The MOVs V4-6 provide ground surge and transient protection. Although both the MOVs V1-3 and the MOVs V4-6 are shown, either the MOVs M1-3 or the MOVs M4-6 may not be utilized and thus removed from the EMI and transient protection circuit 704. The capacitors C2 and C11 may each be replaced with two or more X-capacitors connected in parallel. The X-capacitors may have different capacitances to further provide a broadband spectrum of frequency response. Two or more of the capacitors C3-C10 may be replace with a single capacitor. All of the X-capacitors, MOVs, Y-capacitors may be connected as shown in the schematic with the appropriate components connected in parallel and/or in series. The physical locations of these components may be determined in the layout to maximize performance.

Figure 11:
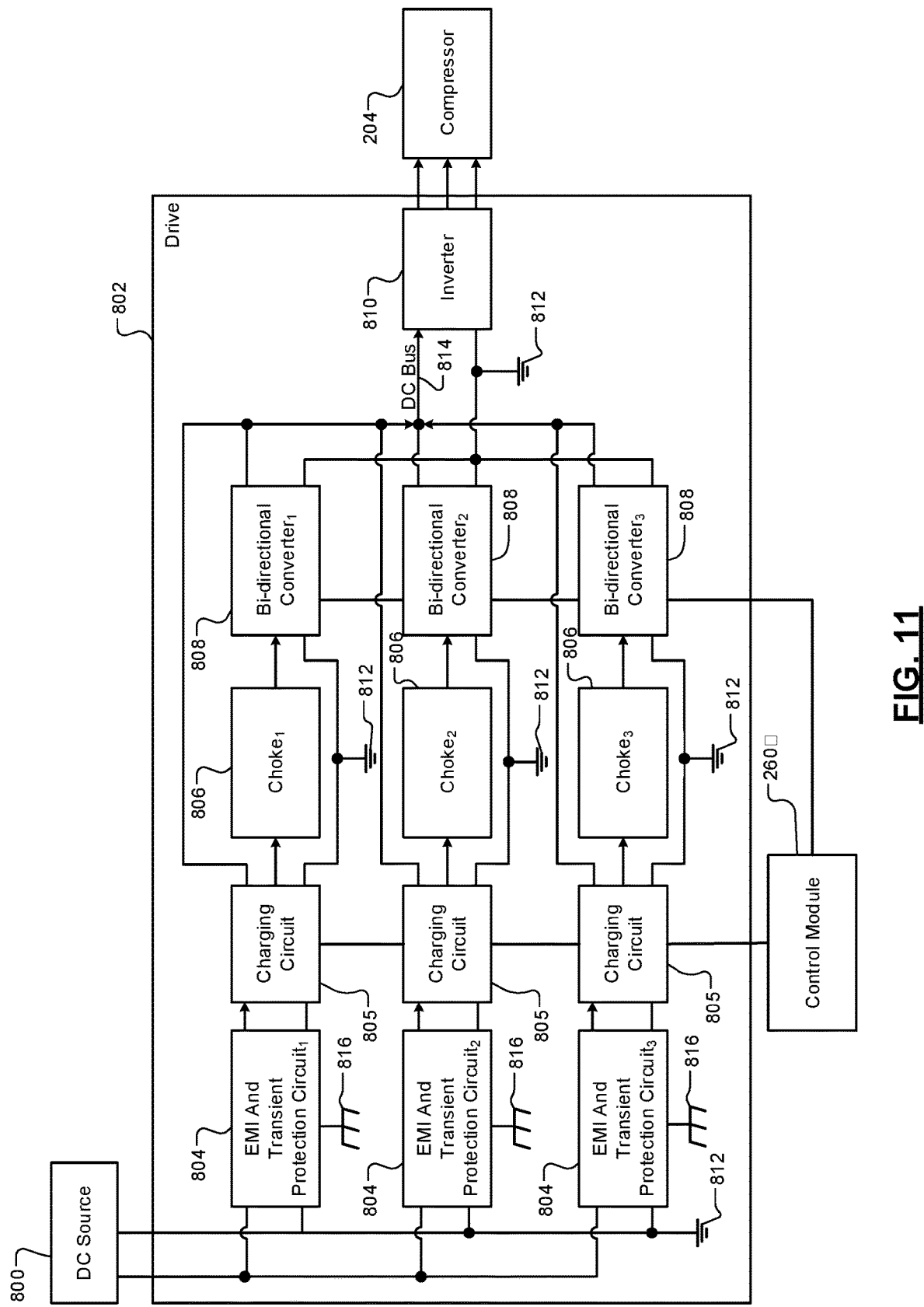
FIG. 11 is a functional block diagram of another example of the drive of FIGS. 1A and 1B.

The conductive element 820 may be connected to the choke 706, as shown or may be connected to a charging circuit (see for example FIG. 11). A rectifier diode D2 may be connected to the conductive element 820 and provide an output to the DC bus 714. The X-capacitors C2, C11 are connected to the first ground 712, wherein as each of the Y-capacitors C3-C10 is connected in series with another capacitor and is connected to the second ground 716. The Y-capacitors C4, C6, C8, C10 are connected to the first ground 712. The negative battery terminal 814 is connected to the negative battery from the DC source.

The capacitors C1-C11 may each have various different capacitances. As an example, the values of the capacitances C1-C11 may vary between 1 nano-farad (nF) and 1 micro-farad (g). By having different capacitors having different capacitance values connected in parallel, a broadband of frequency attenuation is provided. Multiple Y-capacitors having difference capacitances are provided to offset inductances and attenuate a large range of frequencies. The capacitors attenuate noise generated as a result of switching occurring in, for example, the inverter 710.

The common mode choke 810 provides high impedance to a common mode signal to provide EMI filtering and filters an output of the MOVs V1, V2, V3. The common mode choke 810 performs as a DC-to-DC voltage converter. The common mode choke 810 decouples circuits upstream from the common mode choke 810. The common mode choke 810 includes inductors wound around a common core. The inductors 830 are connected to the conductive elements 812, 814 and to the conductive elements 820, 822.

Referring to FIGS. 7-8, by having multiple separate EMI and transient protection circuits 704, the amount of current supplied to each of the EMI and transient protection circuits 704 is reduced by a multiple of the number of EMI and transient protection circuits. In the example shown, the amount of current through each EMI and transient protection circuit is ⅓ of a total amount of current drawn. The reduced levels of current allows for using smaller and less costly components. For example, by having three common mode chokes, one in each of the EMI and transient protection circuits 704, smaller significantly less costly common mode chokes are able to be utilized. As an example, the common mode chokes 810 may be 30-40 Ampere (A) chokes, which is much lower than when a single 100 A choke is used. In an embodiment, the common mode chokes are 3-35 A chokes. In an embodiment, the common mode chokes are standard commercial grade low cost components as opposed to a single high current custom component. The conductive elements 822 of each of the EMI filters on the output of the EMI and transient protection circuits 704 are connected to a same (or common) ground 712. Connection to a common ground allows the current outputs of the EMI and transient protection circuits 704 to be summed. The EMI filters refer to the use of the Y-capacitors C3-C10 and the X-capacitor C11. The incorporation of multiple EMI and transient protection circuits reduces interaction between phases as power is drawn into drive 127 is on an input side of the EMI and transient protection circuits. This allows impedance decoupling of each phase. High-frequency ripple currents tend to circulate locally in each phase and not between the phases at the inputs of the EMI and transient protection circuits. The architecture provides a low cost solution to high-current multi-phase drives with boost converters as compared to a single phase high-current EMI filter approach.

The rectifier diodes D2 of the EMI and transient protection circuits 704 are provided to protect silicon carbide components. The silicon carbide components may be downstream of the capacitors C3-C10, such as transistors in the bi-directional converters 708. The rectifier diodes D2 are used to bypass surge current to the DC bus 714. The rectifier diodes D2 are normally reverse biased and while reverse biased do not pass current. A high voltage spike at the DC source 700 causes the diodes D2 to be forward biased and current is then passed through the diodes D2, bypasses the bi-directional converters 708, and is provided to the DC bus 714.

FIG. 9 shows the bi-directional converters 708 of the drive 127 of FIGS. 1A and 1B. The bi-directional converters 708 are configured as synchronous rectifiers and include pairs of transistors T1 and T2, T3 and T4, and T5 and T6 and pairs of diodes D1 and D2, D3 and D4, and D5 and D6. The diodes D1-D6 are connected respectively across the transistors T1-T6. The transistors T1-T6 are metal-oxide-semiconductor field-effect transistors (MOSFETs), which may be silicon carbide transistors. The gates of the transistors receive control signals CTL1, CTL2, CTL3 from the control module 260 of FIG. 7. The drains of transistors T1, T3, T5 are connected to the DC bus 714. The sources of the transistors T1, T3, T5 are connected to the chokes 706 and to the drains of the transistors T2, T4, T6. The sources of the transistors T2, T4, T6 are connected to −Vbus 716, which is for example decoupled from the input negative battery terminal by common mode chokes 810. The three bi-directional converters 708 when operating in a forward mode may be referred to collectively as an interleaved boost converter having three interleaved channels (or phases). Outputs of the bi-directional converters 708 are provided to the same DC bus 714.

During operation, the control module 260 of FIG. 7 may switch the bi-directional converters 708, such that the bi-directional converters 708 are 120° out of phase from each other and outputs of which are timed and added to minimize ripple currents. As an example and when there are three phases, each phase may be ON for a respective ⅓ of a full cycle of the DC bus 714. The ON duration of the cycle varies with boost ratio meaning Vbus/Vin (Vbat). The control module 260 smooths power being received at the inverter 710 by timing the outputs from each of the bi-directional converters 708 as described. When turning on one of the bi-directional converters 708, a lower one of the transistors in the bi-directional converter, such as one of the transistors T2, T4, T6, is turned ON. At this point, current increases in the inductors 706. A first predetermined period of time after turning ON T2, T4, T6, the transistors T2, T4, T6 are turned OFF and the upper transistors T1, T3, T5 are turned ON and current flows into the DC bus 714 and decays in the inductors 706. A second predetermined period of time after turning OFF T2, T4, T6 and turning ON T1, T3, T5, this pattern is then repeated. As a result, the signal on the DC bus 714 is similar to a triangular wave that is DC biased and does not return to zero, where each phase is summed into the DC bus and the ripple from each phase cancels to varying degrees based upon the boost ratio.

FIG. 9 also shows an example of when the bi-directional converters 708 are operated in the reverse mode and power is supplied from the DC bus 714 back to the DC source 700 to charge for example a battery. Utility power is received at the receptacle 154 (or other receptacle) and provided to either the output of the inverter 710 of FIG. 7 or via a rectifier 900 to the DC bus 714. A switch 902 may be controlled by the controller 260 of FIG. 7 and used to control transfer of power between the receptacle 154 and the inverter 710 or the rectifier 900. If the charging circuit 702 of FIG. 7 has a rectifier, then the shore (or utility) power may be supplied to the charging circuit, instead of being supplied to the inverter 710 or the rectifier 900. The shore power can be supplied directly to the DC link through a rectifier for example. Power may then be supplied, for example, from the shore power input to both the compressor and to the bidirectional converter and batteries in the DC source.

When all phases are operated in a forward mode, the transistors T2, T4, T6 may be tuned ON and then after a predetermined period turned OFF followed by turning ON the transistors T1, T3, T5. When all phases are operated in a reverse mode, the transistors T1, T3, T5 may be tuned ON and then after a predetermined period turned OFF followed by turning ON the transistors T2, T4, T6. Each phase may be operated independently such that one or more of the phases is operated in the forward mode and one or more of the phases are operated in a reverse mode.

Figure 10:
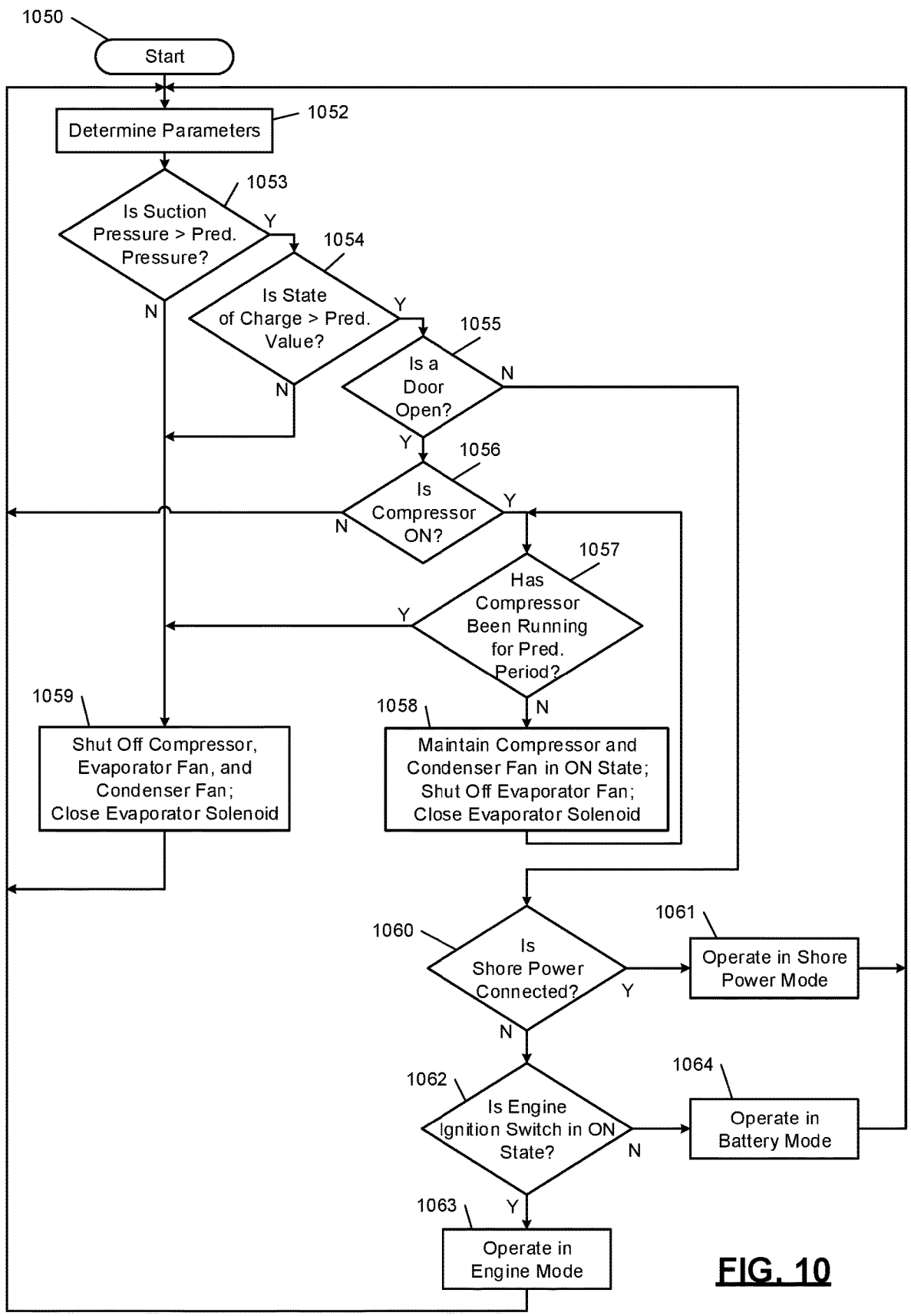
FIG. 10 illustrates a mode selection method in accordance with an embodiment of the present disclosure.

FIG. 10 shows an example mode selection method for determining whether to operate in an engine mode, a battery mode or a shore power mode. As an example, during the engine and shore power modes, the drive 127 of FIG. 7 may be in either the forward or reverse mode depending on whether a battery is being charged. As another example, during the battery mode, the drive 127 may be operated in the forward mode. The systems disclosed herein may be operated using numerous methods, this is one example method. The following tasks may be iteratively performed.

The method may begin at 1050. At 1052, the control module 260, the mode module 400 and/or the load module 402 determine parameters. This may include receiving sensor signals including parameters, such as suction pressure, a shore power connected indicator, battery characteristics, a door position or state indicator, an ignition or engine ON indicator, an electrical source (e.g., alternator and/or generator) indicator, etc. from corresponding sensors. The shore power signal indicates whether the corresponding vehicle is connected to shore power. The battery characteristic signal may indicate a current charge of one or more batteries in, for example, a battery pack (e.g., the battery pack 120 of FIG. 3). The battery characteristic signal may indicate an overall amount of charge of the battery pack. The battery characteristic signal may also indicate a voltage of one or more batteries and/or an overall voltage of the battery pack.

The door position signal may indicate whether one or more doors of a box that is temperature-controlled are open or closed. The ignition signal, the engine indicator and/or the electrical source indicator may indicate ignition is activated (i.e. spark is activated), an engine is running, and/or the electrical source is charging the battery pack. The ignition signal may indicate whether (i) a key is in an ignition switch and the ignition switch is in an ON position, (ii) a vehicle start switch has been depressed and the vehicle is in an ON state, (iii) a vehicle start switch is in an ON state, and/or (iv) the engine of the vehicle is running (i.e. a fuel system and an ignition system of the engine are activated). The vehicle may be in an ON state and an engine of the vehicle may be OFF. The ignition system of the vehicle is OFF when the engine is OFF.

The load module 402 may receive box temperature, return air temperature, and signals from corresponding sensors indicating temperatures in the box, a return air temperature, and/or a supply air temperature. The load module 402 may determine load on a compressor (e.g., compressor 204 and/or motor 216 of FIG. 5) based on these temperatures. The load module 402 may also determine compressor load based on suction pressure and/or discharge pressor of the compressor. The load module 402 may generate a load signal indicating the LOAD on the compressor. The load may be indicated, for example, in cubic-feet-per-minute (CFM) and/or power drawn by the compressor.

At 1053, the mode module 400 determines whether the suction pressure is greater than a predetermined pressure (e.g., 25 pounds per square inch gage (psig)). If the suction pressure is greater than the predetermined pressure, task 1054 is performed, otherwise task 1059 is performed. At 1054, the mode module 400 determines whether a state of charge (e.g., a charge level such as amp-hours or percent of rated capacity and/or voltage of the battery pack) is greater than predetermined value (e.g., if a voltage of the battery pack is greater than 42V). If the state of charge of the battery pack is greater than the predetermined value, then task 1055 is performed, otherwise task 1059 is performed. At 1055, the mode module 400 determines whether one or more doors of the box are closed. If the one or more doors are open then task 1056 is performed, otherwise task 1060 is performed. Tasks 1053, 1054, 1055 may be performed in a different order, simultaneously and/or during a same period of time.

At 1056, the mode module 400 determines whether the compressor 204 is ON. If operating in one of the shore power mode, the engine mode or the battery mode, the mode module 400 continues operating in the one of the shore power mode, the engine mode or the battery mode while performing the method of FIG. 10. If the compressor is ON, then task 1057 is performed, otherwise task 1052 is performed.

At 1057, the mode module 400 determines whether the compressor 204 has been running for more than a predetermined period (e.g., 3 minutes). If the compressor 204 has been running for more than the predetermined period, then task 1059, otherwise task 1058 is performed. This prevents short cycling the compressor 204.

At 1058, the mode module 400 maintains the compressor 204 and the condenser fan 220 in ON State and shuts off the evaporator fan 280 and closes evaporator solenoid 248. This directs coolant to the eutectic plates and not to the evaporator solenoid 248. At 1059, the compressor 204, evaporator fan 280, and the condenser fan 220 are shut off and the evaporator solenoid 248 is closed.

At 1060, the mode module 400 determines whether the vehicle is connected to and receiving shore power from a shore power (or utility power) source. The shore power may be received at battery chargers, a voltage converter, a receptacle, batteries, a power module, and/or the control module 260. Examples of battery chargers, a voltage converter, a receptacle, and batteries are shown in FIG. 2. The shore power signal may indicate when power is received at one or more of the battery chargers, the voltage converter, the receptacle, batteries, the power module, and/or the control module 260. If shore power is received at one or more of the battery chargers, the voltage converter, the receptacle, batteries, the power module, and/or the control module 260, task 1061 is performed, otherwise task 1062 is performed.

Shore power may be provided directly to the DC bus through a rectifier for example, from the bi-directional converter if the bi-directional converter is set up as a 3 phase active input, or through the compressor inverter running as a 3 phase active input. The set up may be configured through sets of relays. If the power from shore power is coming from the compressor inverter, the power may be used to charge the batteries, but the compressor may not be running. If the shore power is fed into the DC bus directly, both the compressor may be running and the batteries may be charged.

At 1061, the control module 260 and the mode module 400 operate in a shore power mode and generate a signal MODE indicating operation in the shore power mode. This may include transitioning from the engine mode or the battery mode to the shore power mode. The batteries are charged with power received from a utility power source. During the shore power mode, suction pressure of the compressor 204 and box temperature are controlled. This may be different than the battery mode and the engine mode during which box temperature is controlled and suction pressure may not be controlled.

At 1062, the mode module 400 determines whether the engine is running based on the ignition signal and/or engine indicator. If the engine is running, task 1063 is performed, otherwise task 1064 is performed. Although tasks 1053, 1054, 1055, 1056, 1059 and 1061 are shown as being performed in particular order, the tasks 1053, 1054, 1055, 1056, 1059 and 1061 may be performed simultaneously and/or during the same period of time. The mode module 400 may continuously monitor the above-stated parameters associated with tasks 1053, 1054, 1055, 1056, 1057, 1060 and 1062 to be able to quickly transition to tasks 1058, 1059, 1061, 1063, 1064.

At 1063, the control module 260 and the mode module 400 operate in an engine mode and generate the signal MODE indicating operation in the engine mode. This may include transitioning from the shore power mode or the battery mode to the engine mode. One or more batteries are charged via an electrical source (e.g., the electrical source 112 of FIG. 1) of the engine during the engine mode. Shore power mode and engine mode may be implemented (or run) simultaneously.

At 1064, the control module 260 and the mode module 400 operate in a battery mode and generate the signal MODE indicating operation in the battery mode. This may include transitioning from the shore power mode or the engine mode to the battery mode. The batteries are not charged during the battery mode. While in the battery mode, box temperature is maintained with reduced evaporator fan speed, condenser fan speed, and/or compressor speed to minimize drain on the batteries.

While operating in the shore power mode, the engine mode and the battery mode, the method of FIG. 10 may be repeated to determine whether to transition between two of the shore power mode, the engine mode and the battery mode.

FIG. 11 shows the drive 802, which may receive power from a DC source 800, such as the battery pack 120 or battery chargers 158 of FIG. 1, the AC-to-DC converter 155, a rectifier connected to and/or receiving utility power, and/or other DC source. The DC source 800 may be implemented within the drive 802. The drive 802 includes EMI and transient protection circuits 804, charging circuits 805, chokes 806, bi-directional converters 808, and an inverter 810, which outputs AC power to the compressor 204.

The EMI and transient protection circuits 804 filter out electromagnetic interference, provide transient voltage protection, provide reverse polarity protection, and provide DC-to-DC voltage conversion. An example of each of the EMI and transient protection circuits 804 is shown in FIG. 8. Although a certain number of EMI and transient protection circuits are shown for a particular number of phases of the drive 802, a different number of EMI and transient protection circuits may be included. Each of the EMI and transient protection circuits 804 receives a same DC voltage from the DC source 800 and is connected to a first ground 812 (e.g., a conductive element connected to a negative battery terminal). The EMI and transient protection circuits 804 provide a first DC output to a DC bus 814 and a second DC output to charging circuits 805 and are connected to a second ground 816 (e.g., a reference ground or earth ground).

The EMI and transient protection circuits 804 reduce EMI that might otherwise be injected back onto a DC line from the drive 802. The EMI and transient protection circuits 804 may also remove or reduce EMI arriving from the DC source 800. Further, the EMI and transient protection circuits 804 protect against power surges, such as may be caused by lightening, and/or other types of power surges and sags.

The charging circuits 805 may include one or more relays, a relay drive circuit, and current limiting elements (CLEs). The CLEs may include resistors, thermistors, or other current limiting elements. The charging circuit 805 controls power supplied from the EMI and transient protection circuits 804 to the chokes 806 and DC bus 814. For example, when the drive 802 initially powers up, the charging circuit 802 may place a current-limiting resistor in series between the EMI and transient protection circuits 804 and the chokes 806 and DC bus 814 to reduce the amount of current inrush. This provides protection against current or power spikes, which can cause various components to prematurely fail. The charging circuit 805 may be used to initially charge capacitors of the EMI and transient protection circuits 804 by controlling the amount of current drawn out of the EMI and transient protection circuits 804.

After initial charging is completed, the charging circuit 802 may close a relay that bypasses the current-limiting resistor. For example, a control module 260' may provide a relay control signal to a relay within the charging circuit 802. The control module 260' may operate similarly as the control module 260 of FIG. 7. In various implementations, the control module 260' may assert the relay control signal to bypass the current-limiting resistor after a predetermined period of time following start up, or based on closed loop feedback indicating that charging is near completion.

The chokes 806 may be referred to as second (or boost) chokes. The chokes 806 are used to pass DC while blocking high frequency current. The bi-directional converters 808 may operate as (i) boost converters when in a forward mode and supply current to the DC bus 814, and (ii) as buck converters when operated in a reverse mode and receive current from the DC bus 814. Examples of the bi-directional converters 808 are shown in FIG. 9. In an embodiment, the number of chokes and the number of bi-direction converters is equal to the number of EMI and transient protection circuits 804. The bi-directional converters 808 may be controlled by the control module 260'. The control module 260' may be implemented as part of the drive 802 or another control module may be implemented as part of the drive 802 and perform some of the operations disclosed herein as being performed by the control module 260'. Outputs of the bi-directional converters 808 are connected to the DC bus 814 and the first ground 812, which in turn are connected to the inverter 810. The DC bus 814 may be connected to and/or provide power to a first one or more devices other than or in addition to the inverter 810. The inverter 810 converts DC power to AC power, which is provided to the compressor 204. The inverter 810 may be connected to and/or provide power to a second one or more devices other than or in addition to the compressor 204. The first one or more device and the second one or more devices may be disposed anywhere in the vehicle 100 of FIG. 1. The first one or more devices and the second one or more devices may include, for example, motors, fans, lights, control modules, etc.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A drive for a mobile compressor, the drive comprising:
a plurality of electromagnetic interference and transient protection circuits comprising respectively a plurality of common mode chokes and at least one component, wherein each of the plurality of common mode chokes is configured to receive a first direct current voltage and is connected to a first ground and a second ground, wherein the at least one component of each of the plurality of electromagnetic interference and transient protection circuits is connected to a third ground, wherein the first ground, the second ground and the third ground are at different voltage potentials;
a second plurality of chokes connected downstream from the plurality of the common mode chokes;
a plurality of converters connected to outputs of the second plurality of chokes and configured to collectively provide a second direct current voltage to a direct current bus; and
an inverter connected to the direct current bus and configured to convert the second direct current voltage to an alternating current voltage to power the mobile compressor downstream from the inverter.

2. The drive of claim 1, wherein:
the first ground is a negative battery terminal;
the second ground is a negative voltage bus reference for the second direct current voltage; and
the third ground is a chassis ground.

3. The drive of claim 1, wherein each of the plurality of electromagnetic interference and transient protection circuits comprises an electromagnetic interference filter and a transient protection component, which are connected to the first ground or the second ground.

4. The drive of claim 3, wherein:
the electromagnetic interference filters comprise capacitors; and
the transient protection components include varistors.

5. The drive of claim 1, wherein the plurality of converters are implemented as a plurality of synchronous rectifiers.

6. The drive of claim 5, further comprising a controller configured to control the plurality of synchronous rectifiers, such that each of the plurality of converters provides a respective portion of a full cycle of an output signal provided to the inverter,
wherein the plurality of synchronous rectifiers collectively provide the output signal on the direct current bus, and wherein the output signal includes the second direct current voltage.

7. The drive of claim 6, wherein:
the plurality of synchronous rectifiers generate respective outputs; and
the controller is configured to control the plurality of synchronous rectifiers, such that each of the outputs of the plurality of synchronous rectifiers is phase shifted from other ones of the plurality of synchronous rectifiers.

8. The drive of claim 5, wherein the plurality of synchronous rectifiers are bi-directional and independently controlled to operate in a forward mode to power the mobile compressor and in a reverse mode to charge a direct current source.

9. The drive of claim 1, wherein each of the plurality of electromagnetic interference and transient protection circuits comprises a damping circuit upstream from a corresponding one of the plurality of common mode chokes.

10. The drive of claim 1, wherein each of the plurality of electromagnetic interference and transient protection circuits comprises an electromagnetic interference filter upstream from a corresponding one of the plurality of common mode chokes.

11. The drive of claim 1, wherein each of the plurality of electromagnetic interference and transient protection circuits comprises one or more transient protection components upstream from a corresponding one of the plurality of common mode chokes.

12. The drive of claim 1, wherein each of the plurality of electromagnetic interference and transient protection circuits comprises a plurality of Y-capacitors having different capacitances downstream from a corresponding one of the plurality of common mode chokes.

13. The drive of claim 1, wherein each of the plurality of electromagnetic interference and transient protection circuits comprises an X-capacitor downstream from a corresponding one of the plurality of common mode chokes.

14. The drive of claim 1, wherein each of the plurality of electromagnetic interference and transient protection circuits comprises one or more transient protection components upstream from a corresponding one of the plurality of common mode chokes.

15. The drive of claim 1, wherein each of the plurality of electromagnetic interference and transient protection circuits comprises a diode configured to bypass current from a corresponding one of the plurality of common mode chokes to the direct current bus, such that the current bypasses a corresponding one of the second plurality of chokes and a corresponding one of the plurality of converters.

16. The drive of claim 1, further comprising a charging circuit connected upstream of the plurality of electromagnetic interference and transient protection circuits and configured to receive power from a direct current source and charge capacitors of the plurality of electromagnetic interference and transient protection circuits.

17. The drive of claim 1, further comprising a plurality of charging circuits downstream of the plurality of electromagnetic interference and transient protection circuits and configured to control transfer of power from the plurality of electromagnetic interference and transient protection circuits to the second plurality of chokes.

18. A drive for a mobile compressor, the drive comprising:
a plurality of electromagnetic interference and transient protection circuits each configured to receive a first direct current voltage and are connected to a first ground or a second ground, wherein each of the plurality of electromagnetic interference and transient protection circuits comprises an electromagnetic interference filter and a transient protection component, wherein the electromagnetic interference filters and the transient protection components are connected to a third ground, and wherein the first ground, the second ground and the third ground are at different voltage potentials;
a first plurality of chokes connected downstream from the plurality of electromagnetic interference and transient protection circuits;
a plurality of synchronous rectifiers connected to outputs of the first plurality of chokes and configured to collectively provide a second direct current voltage to a direct current bus; and
an inverter configured to convert the second direct current voltage to an alternating current voltage to power the mobile compressor downstream from the inverter.

19. The drive of claim 18, wherein:
the first ground is a negative battery terminal;
the second ground is a negative voltage bus reference for the second direct current voltage; and
the third ground is a chassis ground.

20. The drive of claim 18, wherein:
the electromagnetic interference filters include capacitors; and
the transient protection components include varistors.

21. The drive of claim 18, further comprising a controller configured to control the plurality of synchronous rectifiers, such that each of the plurality of synchronous rectifiers provides a respective portion of a full cycle of an output signal provided to the inverter,
wherein the plurality of synchronous rectifiers collectively provide the output signal on the direct current bus, and wherein the output signal includes the second direct current voltage.

22. The drive of claim 21, wherein:
the plurality of synchronous rectifiers generate respective outputs; and
the controller is configured to control the plurality of synchronous rectifiers, such that each of the outputs of the plurality of synchronous rectifiers is phase shifted from other ones of the plurality of synchronous rectifiers.

23. The drive of claim 18, wherein the plurality of synchronous rectifiers are bi-directional and independently controlled to operate in a forward mode to power the mobile compressor and in a reverse mode to charge a direct current source.

24. The drive of claim 18, wherein each of the plurality of electromagnetic interference and transient protection circuits comprises a diode configured to bypass current to the direct current bus, such that the current bypasses a corresponding one of the first plurality of chokes and a corresponding one of the plurality of synchronous rectifiers.

25. The drive of claim 18, wherein the plurality of electromagnetic interference and transient protection circuits comprise respectively a second plurality of chokes.

26. The drive of claim 25, wherein the second plurality of chokes are common mode chokes.

27. The drive of claim 26, wherein each of the plurality of electromagnetic interference and transient protection circuits comprises a damping circuit upstream from a corresponding one of the common mode chokes.

28. The drive of claim 26, wherein each of the electromagnetic interference filters is upstream from a corresponding one of the common mode chokes.

29. The drive of claim 26, wherein each of the transient protection components is upstream from a corresponding one of the common mode chokes.

30. The drive of claim 26, wherein each of the plurality of electromagnetic interference and transient protection circuits comprises a plurality of Y-capacitors having different capacitances downstream from a corresponding one of the common mode chokes.

31. The drive of claim 26, wherein each of the plurality of electromagnetic interference and transient protection circuits comprises an X-capacitor downstream from a corresponding one of the common mode chokes.

32. The drive of claim 26, wherein each of the transient protection components is upstream from a corresponding one of the common mode chokes.

33. The drive of claim 26, wherein each of the transient protection components is downstream from a corresponding one of the common mode chokes.

* * * * *